（12） United States Patent
Wilson et al.

(10) Patent No.: US 9,196,299 B2
(45) Date of Patent: Nov. 24, 2015

(54) SYSTEMS AND METHODS FOR ENHANCED DATA ENCODING AND DECODING

(71) Applicant: LSI Corporation, San Jose, CA (US)

(72) Inventors: Bruce A. Wilson, San Jose, CA (US); Shaohua Yang, San Jose, CA (US); Shu Li, San Jose, CA (US)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 107 days.

(21) Appl. No.: 14/025,104

(22) Filed: Sep. 12, 2013

(65) Prior Publication Data

US 2015/0058693 A1 Feb. 26, 2015

Related U.S. Application Data

(60) Provisional application No. 61/869,641, filed on Aug. 23, 2013.

(51) Int. Cl.
*G06F 11/10* (2006.01)
*G11B 20/18* (2006.01)
*H03M 13/00* (2006.01)

(52) U.S. Cl.
CPC ........ *G11B 20/1833* (2013.01); *G06F 11/1076* (2013.01); *H03M 13/00* (2013.01); *G11B 2020/1853* (2013.01)

(58) Field of Classification Search
CPC ............. G06F 11/1076; G06F 11/108; G06F 11/1092; G06F 11/10; G06F 11/1004; G06F 12/0886; H03M 13/116; H03M 13/611; H03M 13/6561

USPC ......... 714/770, 810, E11.062, 6.24, 763, 758, 714/795, 801, 785, 773; 711/5, E12.103
See application file for complete search history.

(56) References Cited

U.S. PATENT DOCUMENTS

| 4,553,221 A | 11/1985 | Hyatt |
| 4,805,174 A | 2/1989 | Kubot |
| 5,278,703 A | 1/1994 | Rub et al. |
| 5,278,846 A | 1/1994 | Okayama |

(Continued)

FOREIGN PATENT DOCUMENTS

| JP | 2001/319433 A | 11/2001 |
| WO | WO 2010/059264 A1 | 5/2010 |
| WO | WO9 2010/126482 A1 | 11/2010 |

OTHER PUBLICATIONS

Casado et al., Multiple-rate low-density parity-check codes with constant blocklength, IEEE Transations on communications, Jan. 2009, vol. 57, pp. 75-83.

(Continued)

*Primary Examiner* — Phung M Chung

(57) ABSTRACT

Systems and methods relating generally to data processing, and more particularly to systems and methods for encoding and decoding information. As an example, a method is discussed that includes: applying a first level encoding on a section by section basis to a first data portion to yield a first encoding data including a first encoded portion; applying a second level encoding on a section by section basis to the first encoded portion to yield a first parity set; applying a third level encoding on a section by section basis to a combination of the first data portion, the second data portion, and a portion derived from the first encoded portion to yield a second encoding data.

20 Claims, 12 Drawing Sheets

(56) References Cited

U.S. PATENT DOCUMENTS

| | | |
|---|---|---|
| 5,317,472 A | 5/1994 | Schweitzer, III |
| 5,325,402 A | 6/1994 | Ushirokawa |
| 5,351,274 A | 9/1994 | Chennakeshu |
| 5,392,299 A | 2/1995 | Rhines |
| 5,406,593 A | 4/1995 | Chennakeshu |
| 5,417,500 A | 5/1995 | Martinie |
| 5,450,253 A | 9/1995 | Seki |
| 5,513,192 A | 4/1996 | Janku |
| 5,523,903 A | 6/1996 | Hetzler |
| 5,550,810 A | 8/1996 | Monogioudis et al. |
| 5,550,870 A | 8/1996 | Blaker |
| 5,612,964 A | 3/1997 | Haraszti |
| 5,696,504 A | 12/1997 | Oliveros |
| 5,710,784 A | 1/1998 | Kindred |
| 5,717,706 A | 2/1998 | Ikeda |
| 5,719,871 A | 2/1998 | Helm |
| 5,802,118 A | 9/1998 | Bliss |
| 5,844,945 A | 12/1998 | Nam et al. |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | Mccallister |
| 6,023,783 A | 2/2000 | Divsalar |
| 6,029,264 A | 2/2000 | Kobayashi |
| 6,065,149 A | 5/2000 | Yamanaka |
| 6,097,764 A | 8/2000 | McCallister |
| 6,145,110 A | 11/2000 | Khayrallah |
| 6,175,588 B1 | 1/2001 | Visotsky |
| 6,216,249 B1 | 4/2001 | Bliss |
| 6,216,251 B1 | 4/2001 | McGinn |
| 6,266,795 B1 | 7/2001 | Wei |
| 6,317,472 B1 | 11/2001 | Choi |
| 6,351,832 B1 | 2/2002 | Wei |
| 6,377,610 B1 | 4/2002 | Hagenauer |
| 6,381,726 B1 | 4/2002 | Weng |
| 6,393,074 B1 | 5/2002 | Mandyam |
| 6,412,088 B1 | 6/2002 | Patapoutian et al. |
| 6,473,878 B1 | 10/2002 | Wei |
| 6,535,553 B1 | 3/2003 | Limberg et al. |
| 6,625,775 B1 | 9/2003 | Kim |
| 6,643,814 B1 | 11/2003 | Cideciyan et al. |
| 6,697,441 B1 | 2/2004 | Bottomley |
| 6,747,827 B1 | 6/2004 | Bassett et al. |
| 6,748,034 B2 | 6/2004 | Hattori |
| 6,757,862 B1 | 6/2004 | Marianetti, II |
| 6,785,863 B2 | 8/2004 | Blankenship |
| 6,807,238 B1 | 10/2004 | Rhee |
| 6,810,502 B2 | 10/2004 | Eidson |
| 6,839,774 B1 | 1/2005 | Ahn et al. |
| 6,948,113 B1 | 9/2005 | Shaver |
| 6,970,511 B1 | 11/2005 | Barnette |
| 6,975,692 B2 | 12/2005 | Razzell |
| 6,986,098 B2 | 1/2006 | Poeppelman |
| 7,035,327 B2 | 4/2006 | Nakajima et al. |
| 7,047,474 B2 | 5/2006 | Rhee |
| 7,058,853 B1 | 6/2006 | Kavanappillil et al. |
| 7,058,873 B2 | 6/2006 | Song |
| 7,073,118 B2 | 7/2006 | Greenberg |
| 7,093,179 B2 | 8/2006 | Shea |
| 7,117,427 B2 | 10/2006 | Ophir |
| 7,133,228 B2 | 11/2006 | Fung |
| 7,136,244 B1 | 11/2006 | Rothberg |
| 7,184,486 B1 | 2/2007 | Wu |
| 7,191,378 B2 | 3/2007 | Eroz |
| 7,203,887 B2 | 4/2007 | Eroz |
| 7,230,550 B1 | 6/2007 | Mittal |
| 7,237,181 B2 | 6/2007 | Richardson |
| 7,308,061 B1 | 12/2007 | Huang |
| 7,310,768 B2 | 12/2007 | Eidson |
| 7,313,750 B1 | 12/2007 | Feng |
| 7,370,258 B2 | 5/2008 | Iancu |
| 7,415,651 B2 | 8/2008 | Argon |
| 7,502,189 B2 | 3/2009 | Sawaguchi |
| 7,523,375 B2 | 4/2009 | Spencer |
| 7,587,657 B2 | 9/2009 | Haratsch |
| 7,590,168 B2 | 9/2009 | Raghavan |
| 7,596,196 B1 | 9/2009 | Liu et al. |
| 7,646,829 B2 | 1/2010 | Ashley |
| 7,702,986 B2 | 4/2010 | Bjerke |
| 7,738,202 B1 | 6/2010 | Zheng |
| 7,752,523 B1 | 7/2010 | Chaichanavong |
| 7,779,325 B2 | 8/2010 | Song |
| 7,802,172 B2 | 9/2010 | Casado |
| 7,952,824 B2 | 5/2011 | Dziak |
| 7,957,251 B2 | 6/2011 | Ratnakar Aravind |
| 7,958,425 B2 | 6/2011 | Chugg |
| 7,996,746 B2 | 8/2011 | Livshitz |
| 8,018,360 B2 | 9/2011 | Nayak |
| 8,020,069 B1 | 9/2011 | Feng |
| 8,020,078 B2 | 9/2011 | Richardson |
| 8,161,361 B1 | 4/2012 | Song et al. |
| 8,201,051 B2 | 6/2012 | Tan |
| 8,225,168 B2 | 7/2012 | Yu et al. |
| 8,237,597 B2 | 8/2012 | Liu |
| 8,255,765 B1 | 8/2012 | Yeo |
| 8,261,171 B2 | 9/2012 | Annampedu |
| 8,291,284 B2 | 10/2012 | Savin |
| 8,291,299 B2 | 10/2012 | Li |
| 8,295,001 B2 | 10/2012 | Liu |
| 8,296,637 B1 | 10/2012 | Varnica |
| 8,370,711 B2 | 2/2013 | Alrod |
| 8,381,069 B1 | 2/2013 | Liu |
| 8,413,032 B1 | 4/2013 | Song |
| 8,429,498 B1 | 4/2013 | Anholt |
| 8,443,267 B2 | 5/2013 | Zhong et al. |
| 8,458,555 B2 | 6/2013 | Gunnam |
| 8,464,142 B2 | 6/2013 | Gunnam |
| 8,495,462 B1 | 7/2013 | Liu |
| 8,516,339 B1 | 8/2013 | Lesea |
| 8,527,849 B2 | 9/2013 | Jakab |
| 8,949,704 B2 * | 2/2015 | Zhang et al. .................. 714/810 |
| 2001/0010089 A1 | 7/2001 | Gueguen |
| 2001/0016114 A1 | 8/2001 | Van Gestel et al. |
| 2002/0021519 A1 | 2/2002 | Rae |
| 2002/0067780 A1 | 6/2002 | Razzell |
| 2002/0168033 A1 | 11/2002 | Suzuki |
| 2003/0031236 A1 | 2/2003 | Dahlman |
| 2003/0123364 A1 | 7/2003 | Nakajima et al. |
| 2003/0126527 A1 | 7/2003 | Kim et al. |
| 2003/0138102 A1 | 7/2003 | Kohn et al. |
| 2003/0147168 A1 | 8/2003 | Galbraith et al. |
| 2003/0188252 A1 | 10/2003 | Kim |
| 2004/0042436 A1 | 3/2004 | Terry et al. |
| 2004/0194007 A1 | 9/2004 | Hocevar |
| 2004/0228021 A1 | 11/2004 | Yamazaki |
| 2004/0264284 A1 | 12/2004 | Priborsky et al. |
| 2005/0047514 A1 | 3/2005 | Bolinth et al. |
| 2005/0149842 A1 | 7/2005 | Kyung |
| 2005/0210367 A1 | 9/2005 | Ashikhmin |
| 2005/0243456 A1 | 11/2005 | Mitchell et al. |
| 2006/0002689 A1 | 1/2006 | Yang et al. |
| 2006/0159355 A1 | 7/2006 | Mizuno |
| 2006/0195730 A1 | 8/2006 | Kageyama |
| 2007/0168834 A1 * | 7/2007 | Eroz et al. .................. 714/758 |
| 2007/0185902 A1 | 8/2007 | Messinger et al. |
| 2007/0234178 A1 | 10/2007 | Richardson |
| 2007/0297496 A1 | 12/2007 | Park et al. |
| 2008/0037676 A1 | 2/2008 | Kyun et al. |
| 2008/0069373 A1 | 3/2008 | Jiang |
| 2008/0140686 A1 | 6/2008 | Hong |
| 2008/0304558 A1 | 12/2008 | Zhu et al. |
| 2009/0003301 A1 | 1/2009 | Reial |
| 2009/0092174 A1 | 4/2009 | Wang |
| 2009/0106633 A1 | 4/2009 | Fujiwara |
| 2009/0125780 A1 | 5/2009 | Taylor |
| 2009/0132893 A1 | 5/2009 | Miyazaki |
| 2009/0150745 A1 | 6/2009 | Langner et al. |
| 2009/0177852 A1 | 7/2009 | Chen |
| 2009/0185643 A1 | 7/2009 | Fitzpatrick |
| 2009/0216942 A1 | 8/2009 | Yen |
| 2009/0273492 A1 | 11/2009 | Yang et al. |
| 2010/0077276 A1 | 3/2010 | Okamura et al. |
| 2010/0088575 A1 | 4/2010 | Sharon et al. |

(56) References Cited

U.S. PATENT DOCUMENTS

| | | |
|---|---|---|
| 2010/0150252 A1 | 6/2010 | Camp |
| 2010/0172046 A1 | 7/2010 | Liu et al. |
| 2010/0241921 A1 | 9/2010 | Gunnam |
| 2010/0268996 A1 | 10/2010 | Yang |
| 2010/0322048 A1 | 12/2010 | Yang et al. |
| 2010/0325511 A1 | 12/2010 | Oh |
| 2011/0041040 A1 | 2/2011 | Su |
| 2011/0043938 A1 | 2/2011 | Mathew |
| 2011/0066768 A1 | 3/2011 | Brittner et al. |
| 2011/0167227 A1 | 7/2011 | Yang |
| 2011/0258508 A1 | 10/2011 | Ivkovic |
| 2011/0258509 A1* | 10/2011 | Ramamoorthy ............... 714/752 |
| 2011/0264987 A1 | 10/2011 | Li |
| 2011/0299629 A1* | 12/2011 | Luby et al. .................... 375/299 |
| 2011/0307760 A1 | 12/2011 | Pisek |
| 2011/0320902 A1 | 12/2011 | Gunnam |
| 2012/0020402 A1 | 1/2012 | Ibing |
| 2012/0038998 A1 | 2/2012 | Mathew |
| 2012/0063023 A1 | 3/2012 | Mathew |
| 2012/0079353 A1 | 3/2012 | Liikanen |
| 2012/0124118 A1 | 5/2012 | Ivkovic |
| 2012/0182643 A1 | 7/2012 | Zhang |
| 2012/0185744 A1 | 7/2012 | Varnica |
| 2012/0203986 A1 | 8/2012 | Strasser et al. |
| 2012/0207201 A1 | 8/2012 | Xia |
| 2012/0212849 A1 | 8/2012 | Xu |
| 2012/0236428 A1 | 9/2012 | Xia |
| 2012/0262814 A1 | 10/2012 | Li |
| 2012/0265488 A1 | 10/2012 | Sun |
| 2012/0317462 A1 | 12/2012 | Liu et al. |
| 2013/0024740 A1 | 1/2013 | Xia |
| 2013/0031440 A1 | 1/2013 | Sharon |
| 2013/0120169 A1 | 5/2013 | Li |
| 2013/0194955 A1 | 8/2013 | Chang |
| 2013/0198580 A1 | 8/2013 | Chen |
| 2013/0238955 A1 | 9/2013 | D'Abreu |
| 2013/0326306 A1* | 12/2013 | Cideciyan et al. ............ 714/756 |

OTHER PUBLICATIONS

Cui et al., "High-Throughput Layered LDPC Decoding Architecture", IEEE Transactions on Very Large Scale Integration (VLSI) Systems, vol. 17, No. 4 (Apr. 2009).

Fan et al., "Constrained coding techniques for soft iterative decoders" Proc. IEEE Global Telecommun. Conf. vol. 1b, pp. 631-637 (1999).

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Patapoutian et al "Improving Re-Read Strategies by Waveform Averaging" IEEE Transactions on Mag. vol. 37 No. 6, Nov. 2001.

Planjery et al "Finite Alphabet Iterative Decoders, pt 1: Decoding Beyond Beliver Propogation on BSC" Jul. 2012, printed from the internet Apr. 21, 2014 http://arxiv.org/pdf/1207.4800.pd.

Richardson, T "Error Floors of LDPC Codes" Flarion Technologies Bedminster NJ 07921, tjr@flarion.com (not dated).

Shokrollahi "LDPC Codes: An Introduction", Digital Fountain, Inc. (Apr. 2, 2003).

Spagnol et al, "Hardware Implementation of GF(2m) LDPC Decoders", IEEE Transactions on Circuits and Systemsši : Regular Papers, vol. 56, No. 12 (Dec. 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

Vasic, B., "High-Rate Girth-Eight Codes on Rectangular Integer Lattices", IEEE Trans. Communications, vol. 52, Aug. 2004, pp. 1248-1252.

Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.

Xiao, et al "Nested Codes With Multiple Interpretations" retrieved from the Internet URL: http://www.ece.nmsu.edu/~jkliewer/paper/XFKC_CISS06 (retrieved on Dec. 5, 2012).

Yeo et al., "VLSI Architecture for Iterative Decoders in Magnetic Storage Channels", Mar. 2001, pp. 748-755, IEEE trans. Magnetics, vol. 37, No. 2.

Zhang et al., "Analysis of Verification-Based Decoding on the q-ary Symmetric Channel for Large q", IEEE Trans. on Information Theory, vol. 57, No. 10 (Oct. 2011).

Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.

Zhong, "Block-LDPC: A Practical LDPC Coding System Design Approach", IEEE Trans. on Circuits, Regular Papers, vol. 5, No. 4, pp. 766-775, Apr. 2005.

* cited by examiner

SYSTEMS AND METHODS FOR ENHANCED DATA ENCODING AND DECODING

CROSS REFERENCE TO RELATED APPLICATIONS

The present application claims priority to (is a non-provisional of) U.S. Pat. App. No. 61/869,641 entitled "Systems and Methods for Enhanced Data Encoding and Decoding", and filed Aug. 23, 2013 by Wilson et al. The entirety of the aforementioned provisional patent application is incorporated herein by reference for all purposes.

FIELD OF THE INVENTION

Systems and method relating generally to data processing, and more particularly to systems and methods for encoding and decoding information.

BACKGROUND

Data transfers often include encoding of a data set to be transferred to yield an encoded data set, and subsequent decoding of the encoded data set to recover the original data set. The encoding typically includes the addition of information that are designed to aid in recovering data transferred via a potentially lossy medium. In some cases, the encoding and decoding fails to provide sufficient aid in recovering a transferred data set and/or wastes bandwidth by adding too much information to aid in the recovery.

Hence, for at least the aforementioned reasons, there exists a need in the art for advanced systems and methods for data processing.

SUMMARY

Systems and method relating generally to data processing, and more particularly to systems and methods for encoding and decoding information.

Various embodiments of the present invention provide data processing systems that include a two step encoder circuit. The two step encoder circuit is operable to: receive a user data set that includes a first data portion and a second data portion; apply a first level encoding on a first section by section basis to the first data portion to yield a first encoding data, wherein the first encoding data includes a first encoded portion and a second encoded portion; apply a second level encoding on a second section by section basis to the first encoded portion to yield a first parity set; apply a third level encoding on the first section by section basis to a combination of at least the first data portion, the second data portion, and the first encoding data to yield a second parity set; and assemble at least the first data portion, the second data portion, the first parity set and the second parity set to yield an encoded data set.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF SOME EMBODIMENTS

Figure 1:
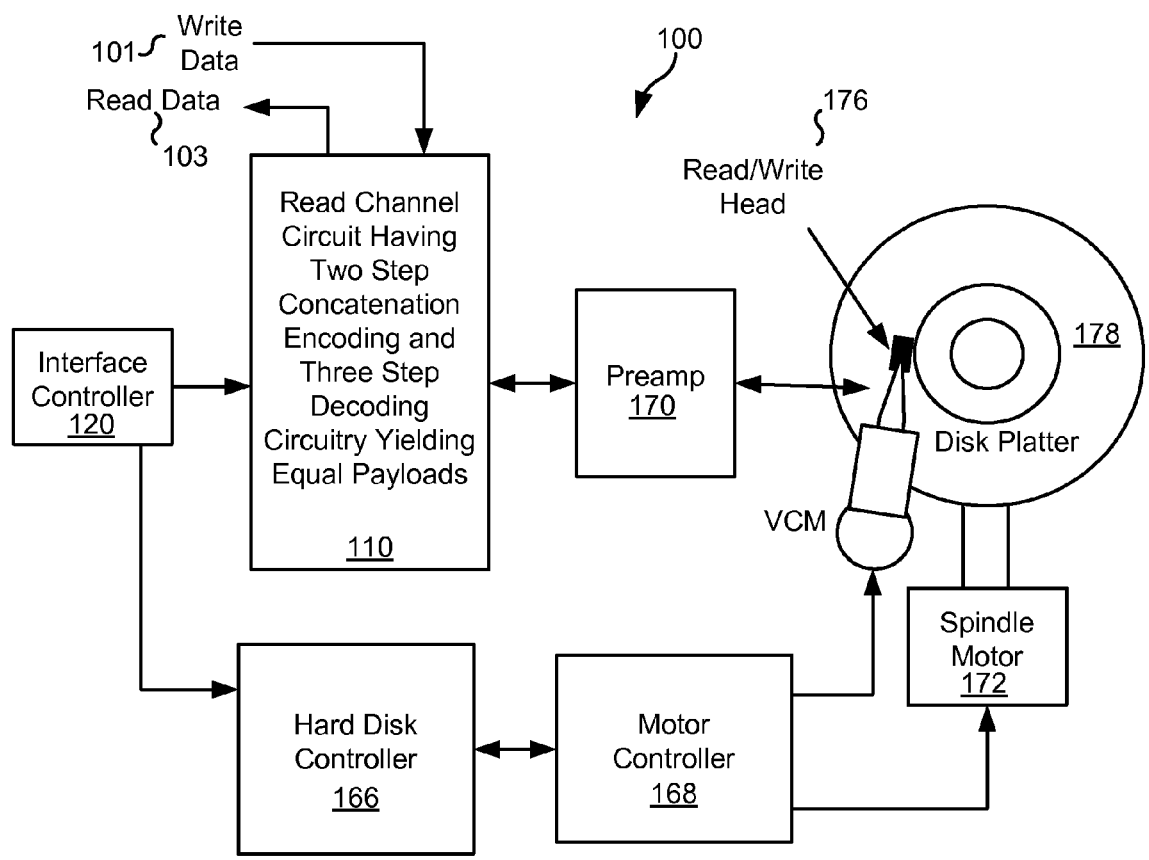
FIG. 1 shows a storage system including a read channel having two step concatenation encoding and three step decoding circuitry yielding equal payloads in accordance with one or more embodiments of the present invention.

Systems and method relating generally to data processing, and more particularly to systems and methods for encoding and decoding information.

Various embodiments of the present invention provide data processing systems that include a two step encoder circuit. The two step encoder circuit is operable to: receive a user data set that includes a first data portion and a second data portion; apply a first level encoding on a first section by section basis to the first data portion to yield a first encoding data, wherein the first encoding data includes a first encoded portion and a second encoded portion; apply a second level encoding on a second section by section basis to the first encoded portion to yield a first parity set; apply a third level encoding on the first section by section basis to a combination of at least the first data portion, the second data portion, and the first encoding data to yield a second parity set; and assemble at least the first data portion, the second data portion, the first parity set and the second parity set to yield an encoded data set.

In some instances of the aforementioned embodiments, the first section by section basis is orthogonal to the second section by section basis. In various cases, the first section by section basis is a row by row basis, and the second section by section basis is a column by column basis. In various instances of the aforementioned embodiments, the first level encoding is a strong row encoding, the third level encoding is a weak row by row encoding, and the second level encoding is a column encoding.

In some instances of the aforementioned embodiments, the user data set further includes a third data portion, and the two step data encoder circuit is further operable to: apply a fourth level encoding on the first section by section basis to a combination of the first data portion, the second data portion, and a portion derived from the first encoded portion to yield a second encoding data, where the second encoding data includes a third encoded portion and a fourth encoded portion; and apply a fifth level encoding on the second section by section basis to the third encoded portion to yield a third parity set. In such instances, applying the third level encoding includes applying the third level encoding on the first section by section basis to a combination of the first data portion, the second data portion, the third data portion, the first encoding data, and the second encoding data to yield the second parity set; and the assembling includes assembling the first data portion, the second data portion, the third data portion, the first parity set, the second parity set and the third parity set to yield the encoded data set.

In some such instances, the first level encoding is a strong row encoding, the third level encoding is a weak row by row encoding, and the fourth level encoding is a medium row encoding. In various of such instances, the data processing system further includes a data decoder circuit. The data decoder circuit is operable to: apply a weak row decoding to the encoded data set on a row by row basis to yield at least a first decoded row and a second decoded row; calculate strong row parity and medium row parity for each of the first decoded row and the second decoded row that failed to converge; reconstruct a medium column code based upon the third parity set; apply erasure decoding to columns corresponding to the third parity set to yield a first syndrome; apply medium row decoding to each of the first decoded row and the second decoded row that failed to converge using the first syndrome to yield first second pass decode row and a second second pass decode row; calculate strong row parity for each of the first second pass decode row and a second second pass decode row that failed to converge; reconstruct a weak column code based upon the first parity set; apply erasure decoding to columns corresponding to the first parity set to yield a second syndrome; apply strong row decoding to each of the f first second pass decode row and a second second pass decode row that failed to converge using the second syndrome to yield first third pass decode row and a second third pass decode row.

Other embodiments of the present invention provide methods for data processing that include: receiving a user data set that includes a first data portion, a second data portion, and a third data portion; applying a first level encoding on a first section by section basis to the first data portion to yield a first encoding data, where the first encoding data includes a first encoded portion and a second encoded portion; applying a second level encoding on a second section by section basis to the first encoded portion to yield a first parity set; applying a third level encoding on the first section by section basis to a combination of the first data portion, the second data portion, and a portion derived from the first encoded portion to yield a second encoding data, wherein the second encoding data includes a third encoded portion and a fourth encoded portion; applying a fourth level encoding on the second section by section basis to the third encoded portion to yield a third parity set; applying a fifth level encoding on the first section by section basis to a combination of at least the first data portion, the second data portion, the third data portion, the first encoding data, and the second encoding data to yield the second parity set; and assembling at least the first data portion, the second data portion, the third data portion; the first parity set, the second parity set, and the third parity set to yield an encoded data set.

In some instances of the aforementioned embodiments, the first level encoding is a strong row encoding, the third level encoding is a medium row encoding, the fifth level encoding is a weak row encoding, the second level encoding is a weak column encoding, and the fourth level encoding is a strong column encoding. In some cases, the methods further include: applying a weak row decoding to the encoded data set on a row by row basis to yield at least a first decoded row and a second decoded row; calculating strong row parity and medium row parity for each of the first decoded row and the second decoded row that failed to converge; reconstructing a medium column code based upon the third parity set; applying erasure decoding to columns corresponding to the third parity set to yield a first syndrome; applying medium row decoding to each of the first decoded row and the second decoded row that failed to converge using the first syndrome to yield first second pass decode row and a second second pass decode row; calculating strong row parity for each of the first second pass decode row and a second second pass decode row that failed to converge; reconstructing a weak column code based upon the first parity set; applying erasure decoding to columns corresponding to the first parity set to yield a second syndrome; and applying strong row decoding to each of the first second pass decode row and a second second pass decode row that failed to converge using the second syndrome to yield first third pass decode row and a second third pass decode row.

In various cases, a data processing circuit is included that includes a data detector circuit and a data decoder circuit. The data detector circuit is operable to apply a data detection algorithm to a codeword to yield a detected output, and the data decoder circuit is operable to apply a data decode algorithm to a decoder input derived from the detected output to yield a decoded output. Processing a codeword through both the data detector circuit and the data decoder circuit is generally referred to as a "global iteration". During a global iteration, the data decode algorithm may be repeated applied. Each application of the data decode algorithm during a given global iteration is referred to as a "local iteration".

Turning to FIG. 1, a storage system 100 is shown that includes a read channel 110 having two step concatenation encoding and three step decoding circuitry yielding equal payloads in accordance with one or more embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head 176. Interface controller 120 controls addressing and timing of data to/from disk platter 178, and interacts with a host controller (not shown). The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In a typical read operation, read/write head 176 is accurately positioned by motor controller 168 over a desired data track on disk platter 178. Motor controller 168 both positions read/write head 176 in relation to disk platter 178 and drives spindle motor 172 by moving read/write head assembly 176 to the proper data track on disk platter 178 under the direction of hard disk controller 166. Spindle motor 172 spins disk platter 178 at a determined spin rate (RPMs). Once read/write head 176 is positioned adjacent the proper data track, magnetic signals representing data on disk platter 178 are sensed by read/write head 176 as disk platter 178 is rotated by spindle motor 172. The sensed magnetic signals are provided as a continuous, minute analog signal representative of the magnetic data on disk platter 178. This minute analog signal is transferred from read/write head 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103 to a receiving circuit. A write operation is substantially the opposite of the preceding read operation with write data 101 being provided to read channel circuit 110. This data is then encoded and written to disk platter 178.

In operation, data written to disk platter 178 is encoded using a two step concatenation encoding that yields equal payloads by read channel circuit 110. In some cases, the encoding may be done by a circuit similar to that discussed below in relation to FIG. 6, and/or may be performed consistent with a process discussed below in relation to FIG. 8. The data accessed from disk platter 178 is decoded using a three step decoding process. In some cases, the decoding may be done by a circuit similar to that discussed below in relation to FIG. 5, and/or may be performed similar to the process discussed below in relation to FIG. 7.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 110 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In addition, it should be noted that storage system 100 may be modified to include solid state memory that is used to store data in addition to the storage offered by disk platter 178. This solid state memory may be used in parallel to disk platter 178 to provide additional storage. In such a case, the solid state memory receives and provides information directly to read channel circuit 110. Alternatively, the solid state memory may be used as a cache where it offers faster access time than that offered by disk platted 178. In such a case, the solid state memory may be disposed between interface controller 120 and read channel circuit 110 where it operates as a pass through to disk platter 178 when requested data is not available in the solid state memory or when the solid state memory does not have sufficient storage to hold a newly written data set. Based upon the disclosure provided herein, one of ordinary skill in the art will recognize a variety of storage systems including both disk platter 178 and a solid state memory.

Figure 2:
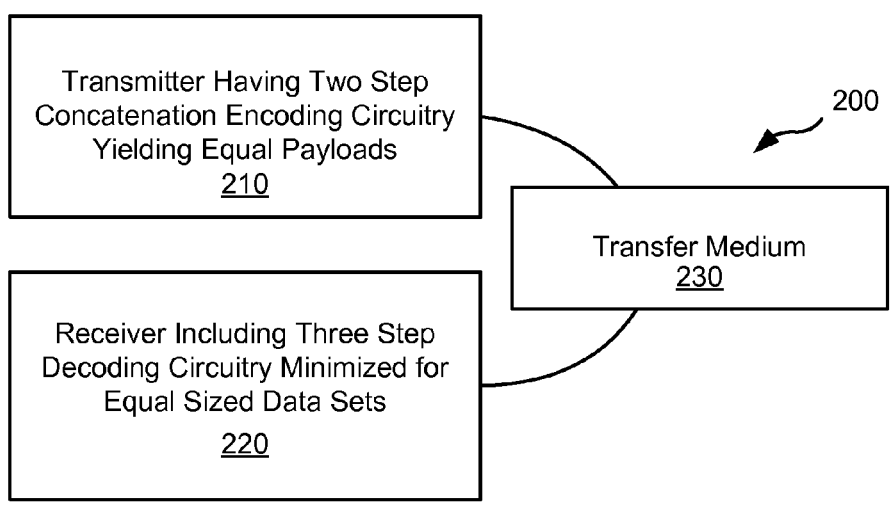
FIG. 2 shows a data transmission system including a transmitter having two step concatenation encoding yielding equal payloads and a receiver including three step decoding circuitry in accordance with one or more embodiments of the present invention.

Turning to FIG. 2, a data transmission system 200 including a transmitter 210 having two step concatenation encoding yielding equal payloads and a receiver 220 including three step decoding circuitry in accordance with one or more embodiments of the present invention. Transmitter 210 transmits encoded data via a transfer medium 230 as is known in the art. The encoded data is received from transfer medium 230 by receiver 220.

During operation, data is received by transmitter 210 where it is encoded. The encoding is a two step encoding that may be performed using a circuit similar to that discussed below in relation to FIG. 6, and/or may be performed consistent with a process discussed below in relation to FIG. 8. The data received via transfer medium 230 is decoded using a three step decoding process. In some cases, the decoding may be done by a circuit similar to that discussed below in relation to FIG. 5, and/or may be performed similar to the process discussed below in relation to FIG. 7.

Figure 3:
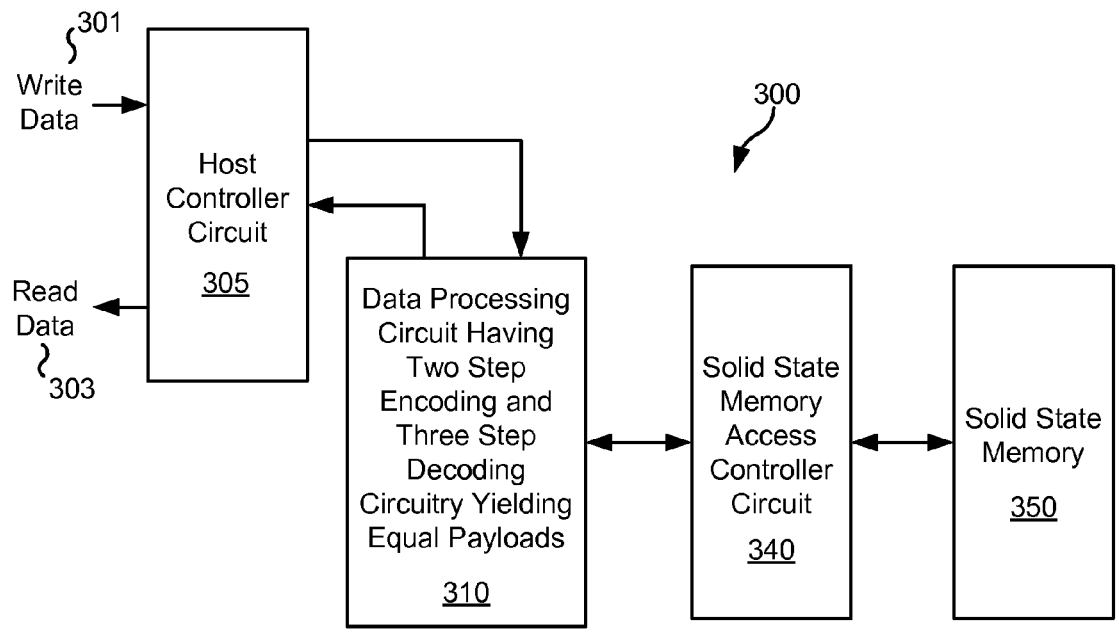
FIG. 3 shows another storage system including a data processing circuit having two step concatenation encoding and three step decoding circuitry yielding equal payloads in accordance with one or more embodiments of the present invention.

Turning to FIG. 3, another storage system 300 is shown that includes a data processing circuit 310 having two step concatenation encoding and three step decoding circuitry yielding equal payloads in accordance with one or more embodiments of the present invention. A host controller circuit 305 receives data to be stored (i.e., write data 301). This data is provided to data processing circuit 310 where it is encoded using a two step encoding yielding equal payloads. The two step encoding may be performed using a circuit similar to that discussed below in relation to FIG. 6, and/or may be performed consistent with a process discussed below in relation to FIG. 8. The encoded data is provided to a solid state memory access controller circuit 340. Solid state memory access controller circuit 340 may be any circuit known in the art that is capable of controlling access to and from a solid state memory. Solid state memory access controller circuit 340 formats the received encoded data for transfer to a solid state memory 350. Solid state memory 350 may be any solid state memory known in the art. In some embodiments of the present invention, solid state memory 350 is a flash memory. Later, when the previously written data is to be accessed from solid state memory 350, solid state memory access controller circuit 340 requests the data from solid state memory 350 and provides the requested data to data processing circuit 310. In turn, data processing circuit 310 decodes the received data and provides the decoded data to host controller circuit 305 where it is passed on as read data 303. In some cases, the decoding may be done by a circuit similar to that discussed below in relation to FIG. 5, and/or may be performed similar to the process discussed below in relation to FIG. 7.

Figure 4A:
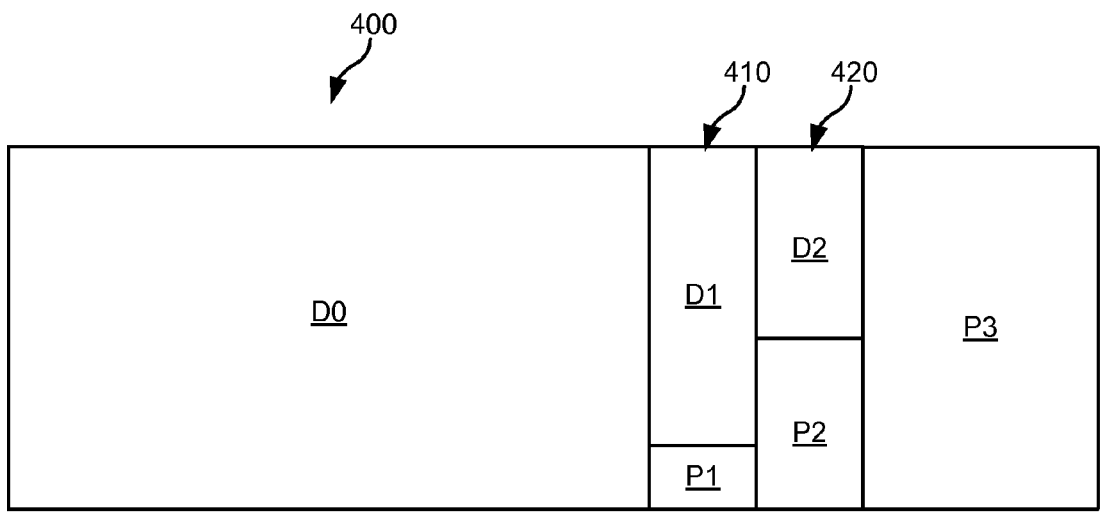
FIG. 4a is a graphical depiction of a codeword encoded in accordance with one or more embodiments of the present invention.

Turning to FIG. 4a, a graphical depiction of a codeword 400 is shown that is encoded in accordance with one or more embodiments of the present invention. Codeword 400 includes an exclusive payload area (D0). As used herein, the term "payload" is used in its broadest sense to mean information included in an encoded data set that is not parity data. Thus, payload includes user data received from a host for transfer via a storage device, communication medium, or other media. In addition, codeword 400 includes two non-exclusive payload areas 410, 420. Non-exclusive payload area 410 includes both a payload (D1) and encoding data (P1), and non-exclusive payload area 420 includes both a payload (D2) and encoding data (P2). In some cases, encoding data (P1) is intermixed with payload (D1) and encoding data (P2) is intermixed with payload (D2) such that each row of codeword 400 includes an equal amount of payload. Codeword 400 further includes an exclusive encoding area (P3).

Figure 4B:
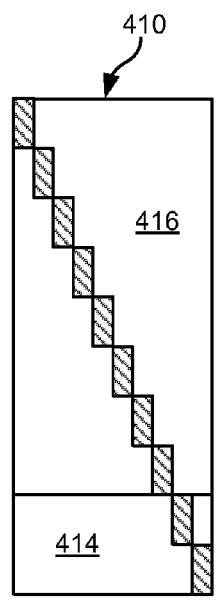
FIG. 4b and FIG. 4c graphically depict detail of sub portions of the codeword of FIG. 4a showing an example of encoding information distribution yielding equal payloads in accordance with various embodiments of the present invention.
Figure 4C:
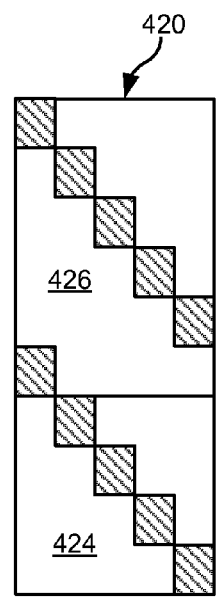

Turning to FIGS. 4b-4c, detail of non-exclusive payload area 410 and non-exclusive payload area 420 are shown with the encoding data intermixed with the payload. In particular, non-exclusive payload area 410 includes a number of rows and columns of data. Portions of encoding data (P1) are shown as diagonal shaded sections distributed throughout a section 416 that without distribution would have been exclusively D1 and a section 414 that without distribution would have been exclusively P1. The unshaded areas in both section 414 and section 416 is D1. As shown, there is an equal payload (i.e., elements of D1) on each row. Non-exclusive payload area 420 includes a number of rows and columns of data. Portions of encoding data (P2) are shown as diagonal shaded sections distributed throughout a section 426 that without distribution would have been exclusively D2 and a section 424 that without distribution would have been exclusively P2. The unshaded areas in both section 424 and section 426 is D2. As shown, there is an equal payload (i.e., elements of D2) on each row.

Figure 5:
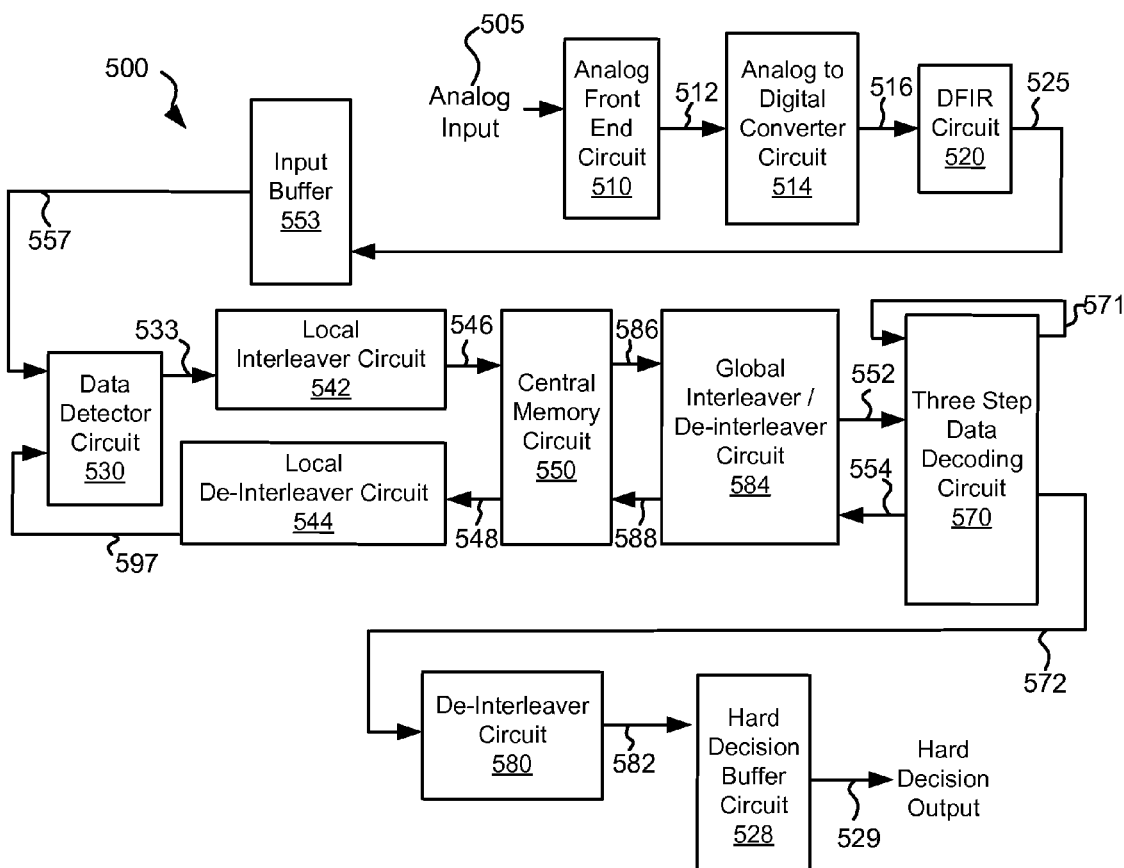
FIG. 5 depicts a data processing system including a three step data decoding circuit in accordance with various embodiments of the present invention.

Turning to FIG. 5, a data processing system 500 including a three step three step data decoding circuit 570 is shown in accordance with various embodiments of the present invention. Data processing system 500 includes an analog front end circuit 510 that receives an analog signal 505. Analog front end circuit 510 processes analog signal 505 and provides a processed analog signal 512 to an analog to digital converter circuit 514. Analog front end circuit 510 may include, but is not limited to, an analog filter and an amplifier circuit as are known in the art. Based upon the disclosure provided herein, one of ordinary skill in the art will recognize a variety of circuitry that may be included as part of analog front end circuit 510. In some cases, analog signal 505 is derived from a read/write head assembly (not shown) that is disposed in relation to a storage medium (not shown). In other cases, analog signal 505 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 505 may be derived.

Analog to digital converter circuit 514 converts processed analog signal 512 into a corresponding series of digital samples 516. Analog to digital converter circuit 514 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 516 are provided to an equalizer circuit 520. Equalizer circuit 520 applies an equalization algorithm to digital samples 516 to yield an equalized output 525. In some embodiments of the present invention, equalizer circuit 520 is a digital finite impulse response filter circuit as are known in the art. It may be possible that equalized output 525 may be received directly from a storage device in, for example, a solid state storage system. In such cases, analog front end circuit 510, analog to digital converter circuit 514 and equalizer circuit 520 may be eliminated where the data is received as a digital data input. Equalized output 525 is stored to an input buffer 553 that includes sufficient memory to maintain a number of codewords until processing of that codeword is completed through a data detector circuit 530 and three step data decoding circuit 570 including, where warranted, multiple global iterations (passes through both data detector circuit 530 and three step data decoding circuit 570) and/or local iterations (passes through three step data decoding circuit 570 during a given global iteration). An output 557 is provided to data detector circuit 530.

Data detector circuit 530 may be a single data detector circuit or may be two or more data detector circuits operating in parallel on different codewords. Whether it is a single data detector circuit or a number of data detector circuits operating in parallel, data detector circuit 530 is operable to apply a data detection algorithm to a received codeword or data set. In some embodiments of the present invention, data detector circuit 530 is a Viterbi algorithm data detector circuit as are known in the art. In other embodiments of the present invention, data detector circuit 530 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. In some cases, one data detector circuit included in data detector circuit 530 is used to apply the data detection algorithm to the received codeword for a first global iteration applied to the received codeword, and another data detector circuit included in data detector circuit 530 is operable apply the data detection algorithm to the received codeword guided by a decoded output accessed from a central memory circuit 550 on subsequent global iterations.

Upon completion of application of the data detection algorithm to the received codeword on the first global iteration, data detector circuit 530 provides a detector output 533. Detector output 533 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detector output 533 is provided to a local interleaver circuit 542. Local interleaver circuit 542 is operable to shuffle sub-portions (i.e., local chunks) of the data set included as detected output and provides an interleaved codeword 546 that is stored to central memory circuit 550. Interleaver circuit 542 may be any circuit known in the art that is capable of shuffling data sets to yield a re-arranged data set. Interleaved codeword 546 is stored to central memory circuit 550.

Once three step data decoding circuit 570 is available, a previously stored interleaved codeword 546 is accessed from central memory circuit 550 as a stored codeword 586 and globally interleaved by a global interleaver/de-interleaver circuit 584. Global interleaver/de-interleaver circuit 584 may be any circuit known in the art that is capable of globally rearranging codewords. Global interleaver/De-interleaver circuit 584 provides a decoder input 552 into three step data decoding circuit 570. Decoder output 552 may encoded similar to that discussed above in relation to FIGS. 4a-4c including distribution of encoding data to yield equal payloads, or without distribution of encoding data leaving unequal payloads. In some embodiments of the present invention, the data decode algorithm is a low density parity check algorithm as are known in the art. Based upon the disclosure provided herein, one of ordinary skill in the art will recognize other decode algorithms that may be used in relation to different embodiments of the present invention. Three step data decoding circuit 570 applies a data decode algorithm to decoder input 552 to yield a decoded output 571. In cases where another local iteration (i.e., another pass trough data decoder circuit 570) is desired, three step data decoding circuit 570 re-applies the data decode algorithm to decoder input 552 guided by decoded output 571. This continues until either a maximum number of local iterations is exceeded or decoded output 571 converges (i.e., completion of standard processing).

Where decoded output 571 fails to converge (i.e., fails to yield the originally written data set) and a number of local iterations through data decoder circuit 570 exceeds a threshold, the resulting decoded output is provided as a decoded output 554 back to central memory circuit 550 where it is stored awaiting another global iteration through a data detector circuit included in data detector circuit 530. Prior to storage of decoded output 554 to central memory circuit 550, decoded output 554 is globally de-interleaved to yield a globally de-interleaved output 588 that is stored to central memory circuit 550. The global de-interleaving reverses the global interleaving earlier applied to stored codeword 586 to yield decoder input 552. When a data detector circuit included in data detector circuit 530 becomes available, a previously stored de-interleaved output 588 is accessed from central memory circuit 550 and locally de-interleaved by a de-interleaver circuit 544. De-interleaver circuit 544 re-arranges decoder output 548 to reverse the shuffling originally performed by interleaver circuit 542. A resulting de-interleaved output 597 is provided to data detector circuit 530 where it is used to guide subsequent detection of a corresponding data set previously received as equalized output 525.

Alternatively, where the decoded output converges (i.e., yields the originally written data set), the resulting decoded output is provided as an output codeword 572 to a de-interleaver circuit 580 that rearranges the data to reverse both the global and local interleaving applied to the data to yield a de-interleaved output 582. De-interleaved output 582 is provided to a hard decision buffer circuit 528 buffers de-interleaved output 582 as it is transferred to the requesting host as a hard decision output 529.

In operation, an encoded data set (e.g., a data set similar to that discussed above in relation to FIGS. 4a-4c) is received as decoder input 552. A first decoding step is applied to decoder input 552. This first decoding step includes applying a weak code decoding (i.e., the inverse of weak code encoding applied during the creation of decoder input by a data encoder) to the first selected row of decoder input 552. It is determined whether the first row converged (i.e., the decoding of the first row results in correction of all errors). Where the first row converged, strong row parity (i.e., parity (SP1) generated during the encoding process when strong code encoding was applied during the creation of decoder input by the data encoder) for the non-exclusive payload area including D1 (i.e., non-exclusive payload area 410) is calculated; and medium row parity (i.e., parity (MP2) generated during the encoding process when medium code encoding was applied during the creation of decoder input by the data encoder) for the non-exclusive payload area including D2 (i.e., non-exclusive payload area 420) is calculated. Alternatively, where the first row failed to converge, equalized output 525 for the failed row is maintained in central memory circuit 550. This process of decoding is repeated until all of the rows have been initially processed in the first decoding step.

Figure 9I:
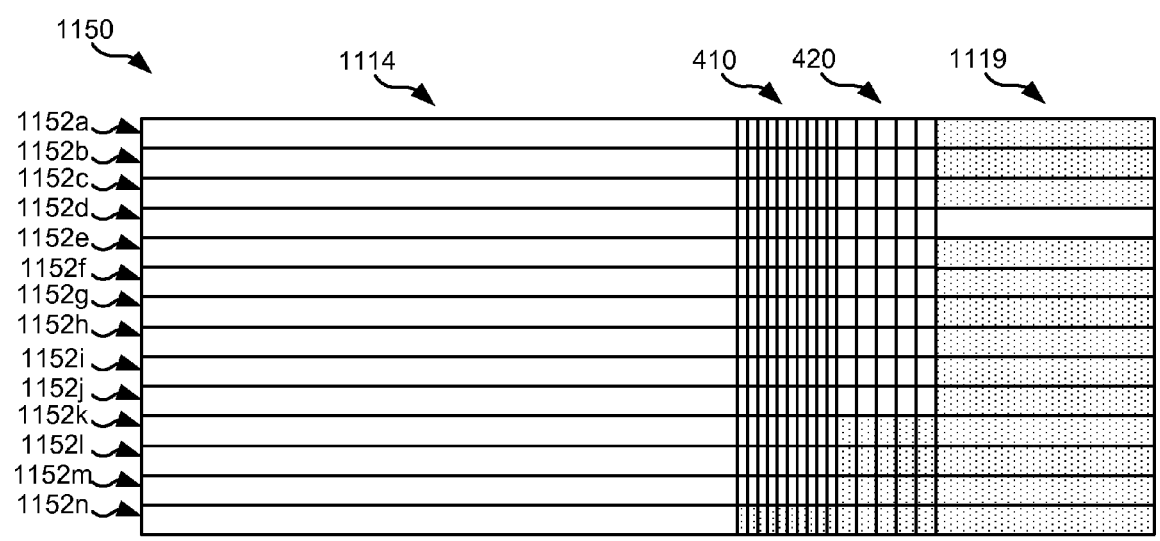
FIGS. 9a-9i are graphical representations of different stages of codeword decoding in accordance with some embodiments of the present invention.
Figure 9A:
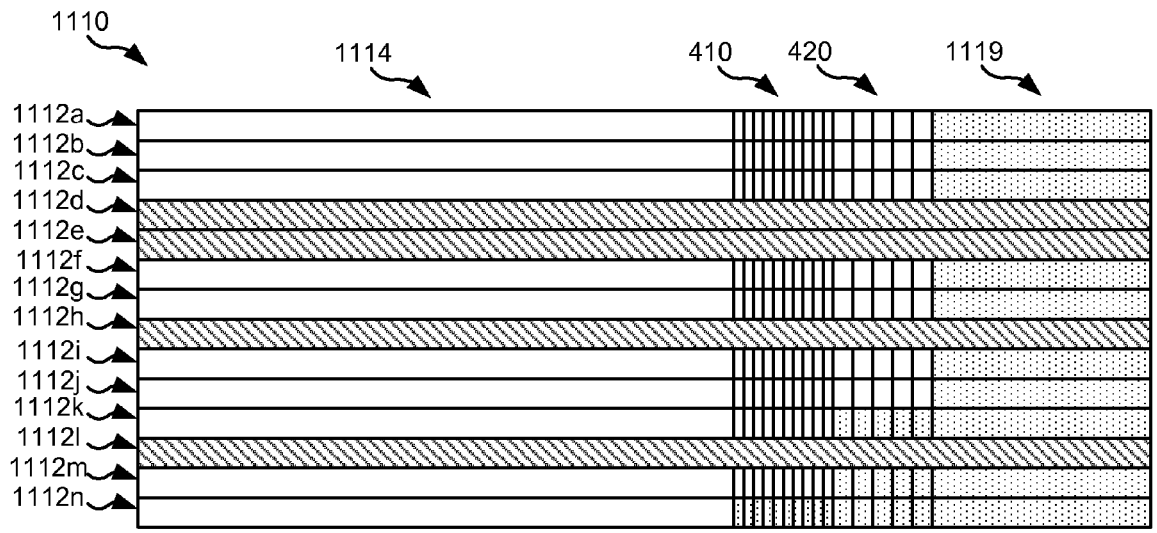

Decoding result 1110 of FIG. 9a graphically depicts an example result after application of the first decoding step. As shown, result 1110 includes a number of rows 1112a-1112n that each include an exclusive payload area 1114 corresponding to D0 of FIG. 4, non-exclusive payload area 410; non-exclusive payload area 420; and an exclusive encoding area 1119 corresponding to P3 of FIG. 4. As shown, four rows (i.e., row 1112d, row 1112e, row 1112h and row 1112l) failed to converge as indicated by the diagonal shading. All of the other rows (i.e., row 1112a, row 1112b, row 1112c, row 1112f, row 1112g, row 1112i, row 1112j, row 1112k, row 1112m and row 1112n), they all converged.

Figure 9B:
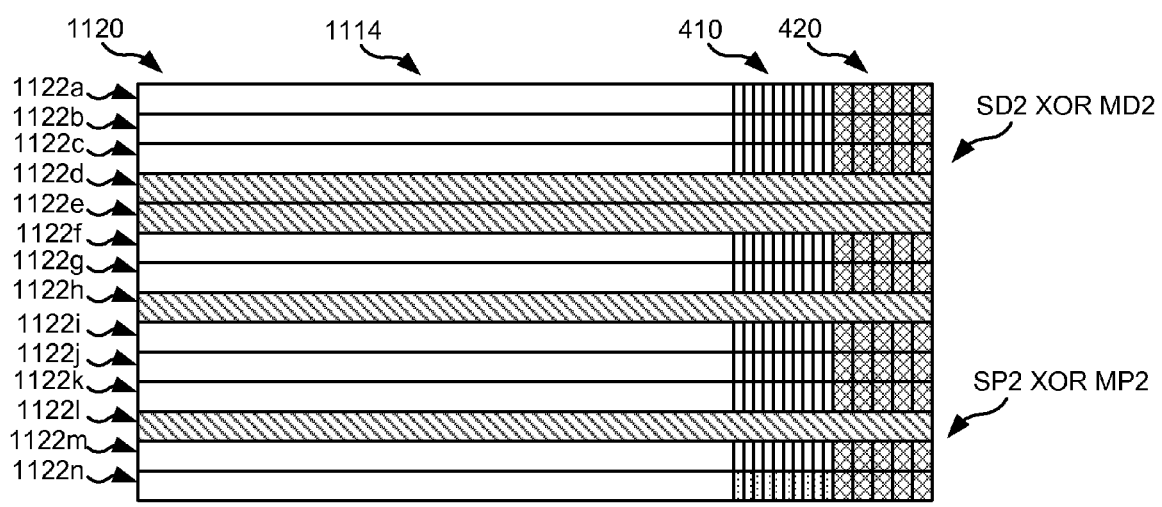
Figure 9C:
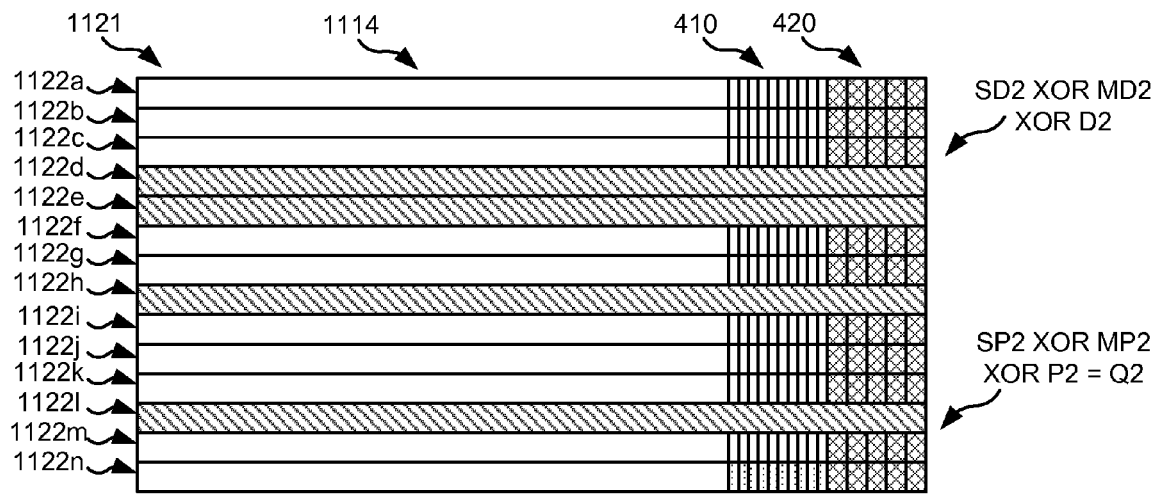

In a second decoding step, a medium column code (i.e., column code (Q2) generated during the encoding process when column encoding of non-exclusive payload area 420 is performed) is reconstructed. This reconstruction includes XORing strong data (SD2) with medium data (MD2), and XORing strong parity (SP2) with medium parity (MP2). Result 1120 of FIG. 9b graphically depicts the result after application of the aforementioned reconstruction step. It will be recognized by one of ordinary skill in the art that the term "XOR" refers to the logical process of an exclusive OR. As shown, result 1120 still exhibits a sub-row 1122d (a truncated version of row 1112d), a sub-row 1122e (a truncated version of row 1112e), a sub-row 1122h (a truncated version of row 1112h), and a sub-row 1122l (a truncated version of row 1112l) that failed to converge. The result of XORing strong data (SD2) with medium data (MD2) is XORed with D2, and the result of XORing strong parity (SP2) with medium parity (MP2) is XORed with medium parity (P2) to yield medium column codes.

Figure 9D:
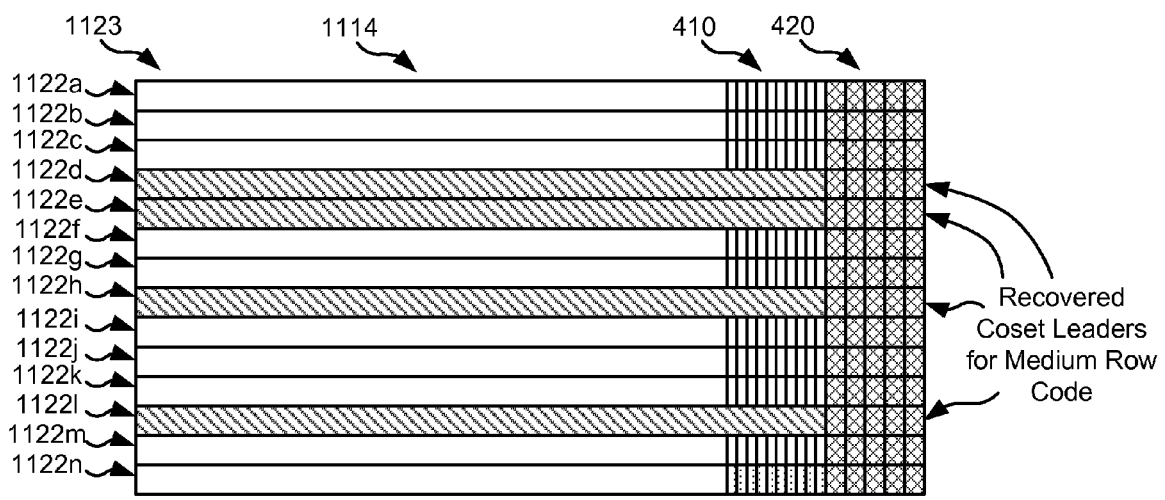
Figure 9E:
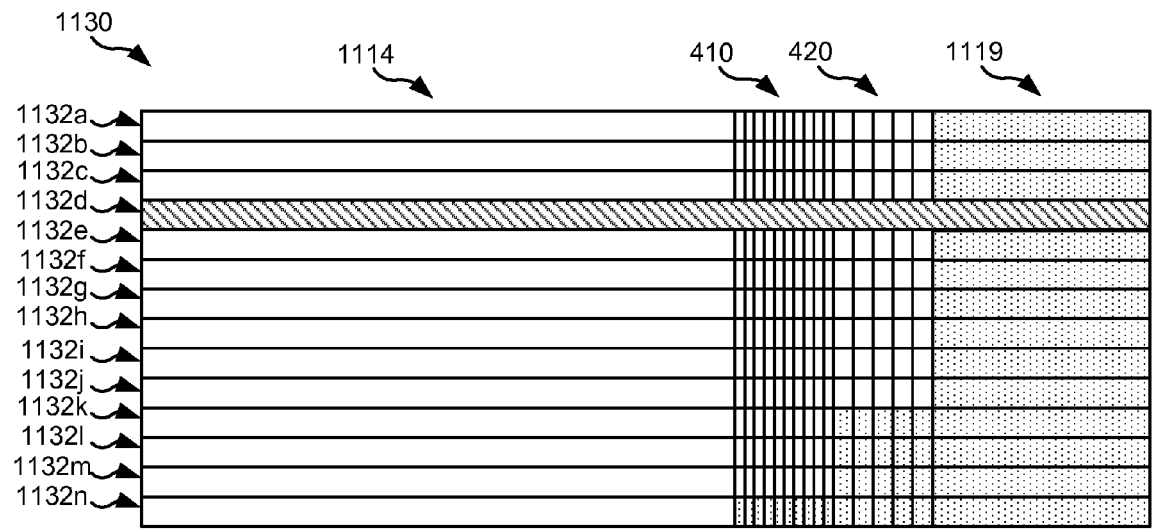
Figure 9F:
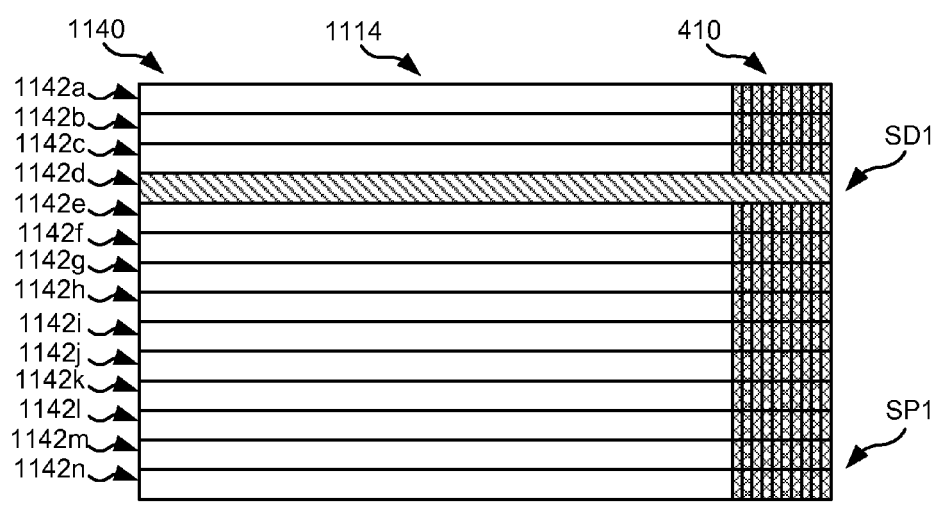

Using the calculated medium column codes, erasure decoding is applied to columns to recover the syndrome for each of the failed rows (i.e., row 1112d, row 1112e, row 1112h, and row 1112l). These syndromes are shown in result 1123 of FIG. 9d where the coset leaders for the medium row code are recovered. At this juncture, the columns of non-exclusive payload region 420 is correct. Medium code decoding is then applied to each of the previously failed rows (i.e., row 1112d, row 1112e, row 1112h and row 1112l) modified to include the recovered row elements. A result 1130 of FIG. 9e shows an example of the medium row code decoding where only one row (i.e., a row 1132d) remains to converge (i.e., three of the previously failed rows are corrected). For the newly converged rows (i.e., row 1132e, row 1132h and row 1132l), strong row parity (SP1 and SD1) for the non-exclusive payload area 410 is calculated. A result 1140 of FIG. 9f provides an example of this calculation of the codeword truncated to exclude strong row parity with non-exclusive payload area 420 and an exclusive encoding area 1119.

Figure 9G:
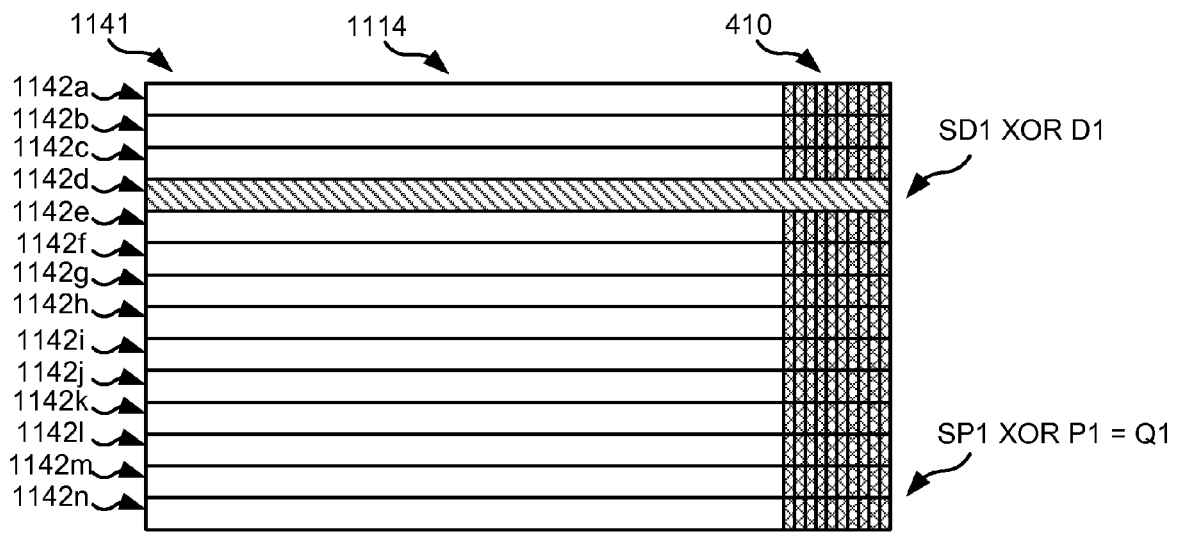

In a third decoding step, a weak column code (i.e., column code (Q1) generated during the encoding process when column encoding of non-exclusive payload area 410 is performed) is reconstructed. This reconstruction includes XORing strong data (SD1) with data (D1), and XORing strong parity (SP1) with encoding data (P1) to yield Q1. Result 1141 of FIG. 9g graphically depicts the result after application of the aforementioned reconstruction step. As shown, result 1141 still exhibits a sub-row 1142d (a truncated version of row 1112d) that failed to converge. The result of XORing strong data (SD1) with data (D1) and XORing strong parity (SP1) with encoding data (P1) are weak column codes.

Figure 9H:
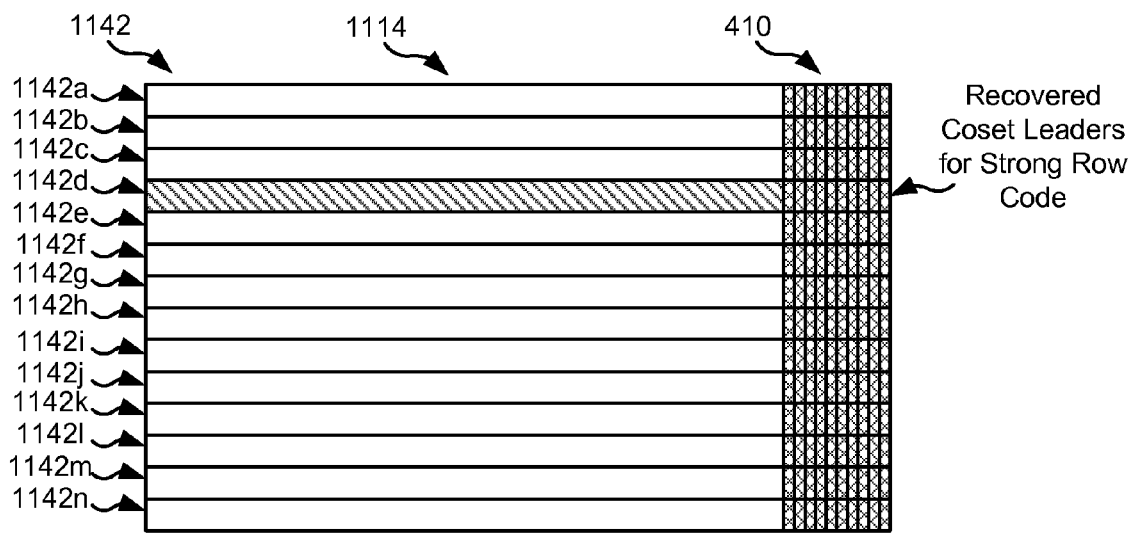

Using the calculated weak column codes, erasure decoding is applied to columns to recover the syndrome for each of the failed rows (i.e., row 1112d). These syndromes are shown in result 1142 of FIG. 9h where the coset leaders for the weak row code are recovered. At this juncture, the columns of non-exclusive payload region 410 is correct. Strong code decoding is then applied to each of the previously failed rows (i.e., row 1112d) modified to include the recovered row elements. A result 1130 of FIG. 9i shows an example of the strong row code decoding where no rows remain to converge. Where all rows have converged, all of the rows re provided as a decoded output. Otherwise, an error is indicated and it is determined whether another local iteration or another global iteration is desired.

Figure 6:
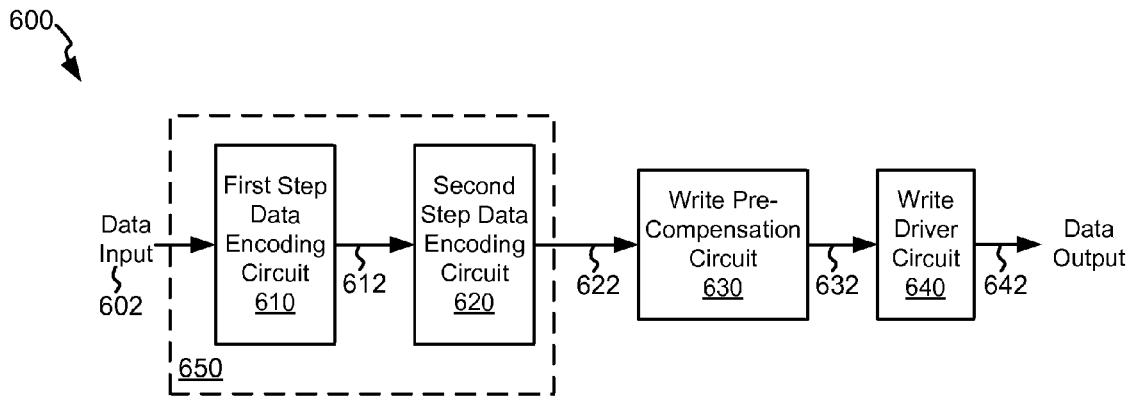
FIG. 6 shows a data processing system including a two step encoding circuit in accordance with some embodiments of the present invention.

Turning to FIG. 6, a data processing system 600 including a two step encoding circuit 650 in accordance with some embodiments of the present invention. Two step encoding circuit 650 includes a first step encoding circuit 610 and a second step encoding circuit 620. A data input 602 is provided to two step encoding circuit 650 where it is encoded to yield a codeword 622 similar to that discussed above in relation to FIGS. 4a-4c. Data input 602 may be any set of data intended to be incorporated into a payload of codeword 622. Codeword 622 is provided to a write pre-compensation circuit 630 that may be any circuit known in the art that is capable of modifying or arranging codeword 622 in a format and/or domain suitable for transfer via a transfer medium (not shown). Such a transfer medium may be, but is not limited to, a storage medium or a communication medium. Write pre-compensation circuit 630 generates a compensated output 632 that is provided to a write driver circuit 640. Write driver circuit 640 may be any circuit capable of providing the received information to the transfer medium as a data output 642. As such, write driver circuit 640 may be, but is not limited to, a solid state storage device write circuit, a magnetic storage device write circuit, or a data transmission circuit.

Figure 10A:
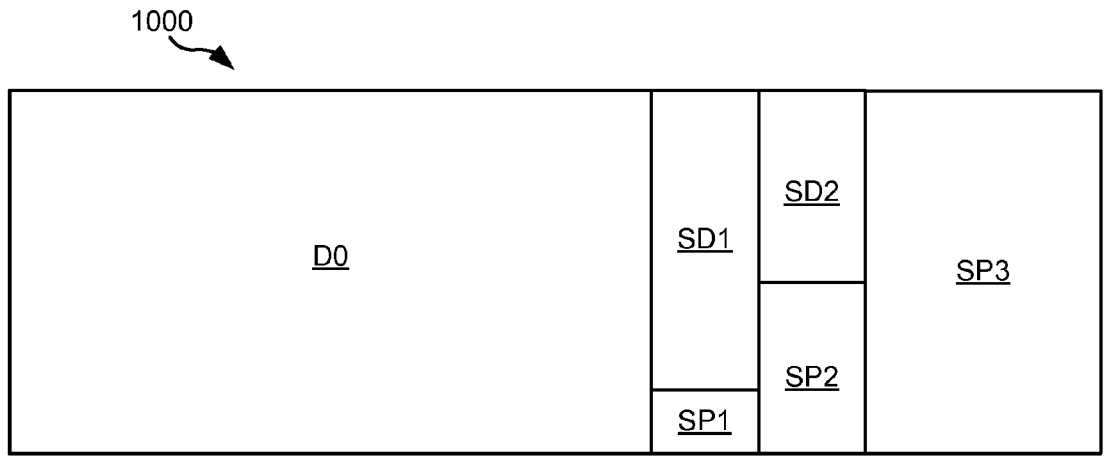
FIGS. 10a-10e are graphical representations of different stages of codeword encoding in accordance with some embodiments of the present invention.

In operation, first step data encoding circuit 610 applies strong row encoding to a first subset (D0) of data input 602 to yield strong parity blocks (SD1, SP1, SD2, SP2, SP3). An example result 1000 from applying strong row encoding is shown in FIG. 10a. As used herein, the phrase "strong row encoding" is used in its broadest sense to mean an encoding that generates an amount of encoding data for one direction of an array of data that is greater than both "medium row encoding" and "weak row encoding". By implication, the phrase "medium row encoding" is used in its broadest sense to mean an encoding that generates an amount of encoding data for one direction of an array of data that is greater than "weak row encoding" and less than "strong row encoding"; and the phrase "weak row encoding" is used in its broadest sense to mean an encoding that generates an amount of encoding data for one direction of an array of data that is less than both "strong row encoding" and "medium row encoding". As an example, for a first row of result 1000, strong row encoding generates SD1, SD2 and SP3 encoding data along a row corresponding to the first row of D0. As another example, for a last row of result 1000, strong row encoding generates SP1, SP2 and SP3 encoding data along a row corresponding to the last row of D0.

Figure 10B:
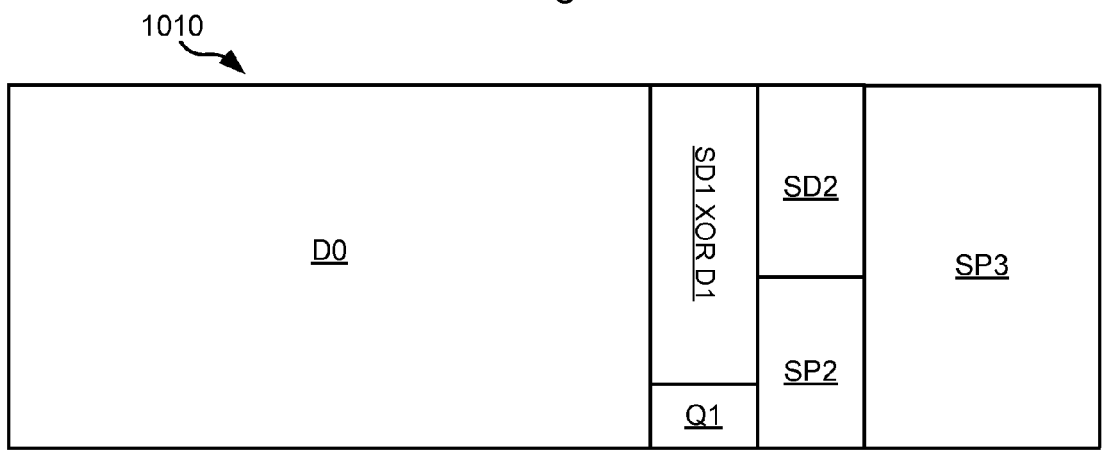

First step data encoding circuit 610 XORs the strong parity block (SP1) with a second subset (D1) to yield a first modified parity block. Weak column encoding is applied to the first modified parity block to yield a first column code (Q1). As used herein, the phrase "weak column encoding" is used in its broadest sense to mean an encoding that generates an amount of encoding data for a direction different from row encoding of an array of data that is greater than both "medium column encoding" and "strong column encoding". By implication, the phrase "medium column encoding" is used in its broadest sense to mean an encoding that generates an amount of encoding data for a direction different from row encoding of an array of data that is greater than "weak column encoding" and less than "strong column encoding"; and the phrase "strong column encoding" is used in its broadest sense to mean an encoding that generates an amount of encoding data for a direction different from row encoding of an array of data that is greater than both "strong column encoding" and "medium column encoding". An example result 1010 from applying the aforementioned weak column encoding is shown in FIG. 10b.

Figure 10C:
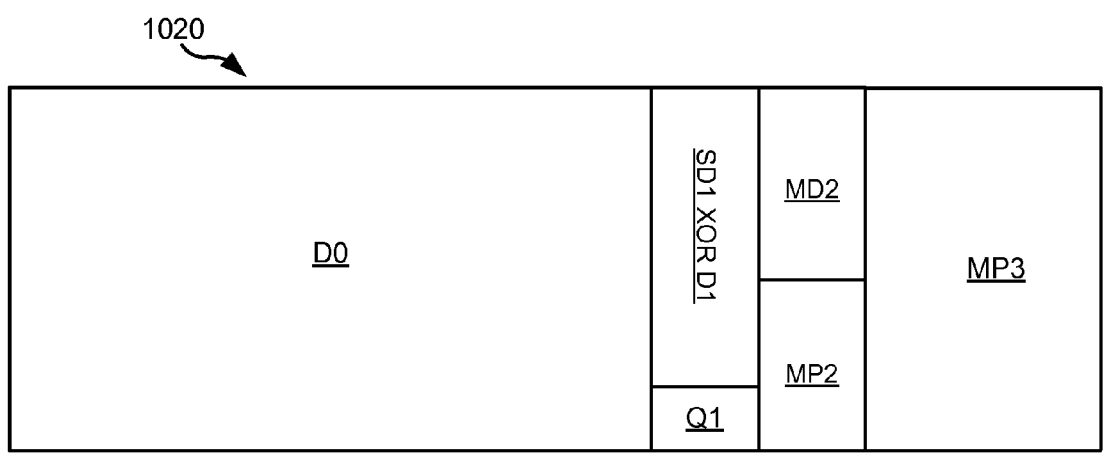
Figure 10D:
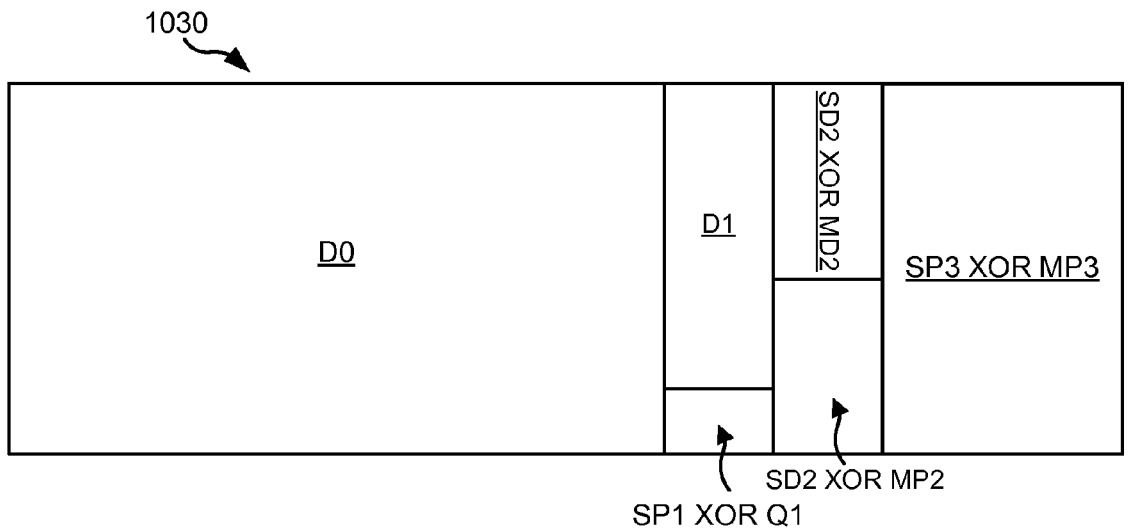
Figure 10E:
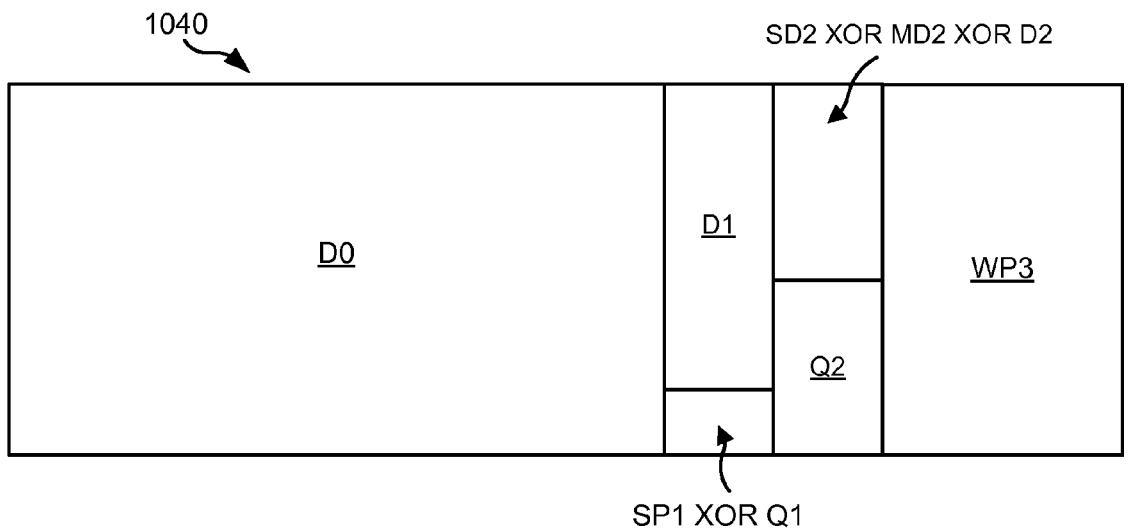

Parity data P1 is then calculated from the first column code Q1 and the strong parity code SP1 by XORing SP1 and Q1. This parity data is then stored for inclusion in the final encoded codeword. Medium row encoding is then applied to D0 and the columns including SD1 XOR D1 and Q1 to yield medium row encoded data MD2, MP2, MP3. An example result 1020 from applying the aforementioned medium row encoding is shown in FIG. 10c. The strong parity block SD2 is XORed with the medium parity block MD2 and the medium parity block MP2 to yield a second modified parity block. An example result 1030 from applying the aforementioned processing is shown in FIG. 10d. The second modified parity block is then XORed with a third user data set D2 to yield a third modified parity block. Medium column encoding is applied to the third modified parity block to yield a second column code Q2. An example result 1040 from applying the aforementioned processing is shown in FIG. 10e. Parity data P2 is then calculated from the second column code Q2, the strong parity block SD2, and the medium parity block MP2. This parity data is then stored for inclusion in the final encoded codeword. D0, D1, D2, P1 and P2 are transferred as a partial encoded output 612 to second step data encoding circuit 620.

Second step data encoding circuit 620 assembles D0, D1, D2, P1 and P2 into an interim encoded data set with P1 and P2 distributed throughout the data set to yield a uniform sector payload. This interim encoded data set is similar to codeword 400 of FIG. 4*a* without the area identified as P3. P1 is distributed throughout non-exclusive payload area 410 similar to that discussed in relation to FIG. 4*b*, and P2 is distributed throughout non-exclusive payload area 420 similar to that discussed in relation to FIG. 4*c*. Weak row encoding is then applied to D0, non-exclusive payload area 410 and non-exclusive payload area 420 to yield parity data P3. Parity data P3 is incorporated with the interim encoded data set to yield an encoded data set that is then transferred as encoded output 622 to write pre-compensation circuit 630.

Figure 7:
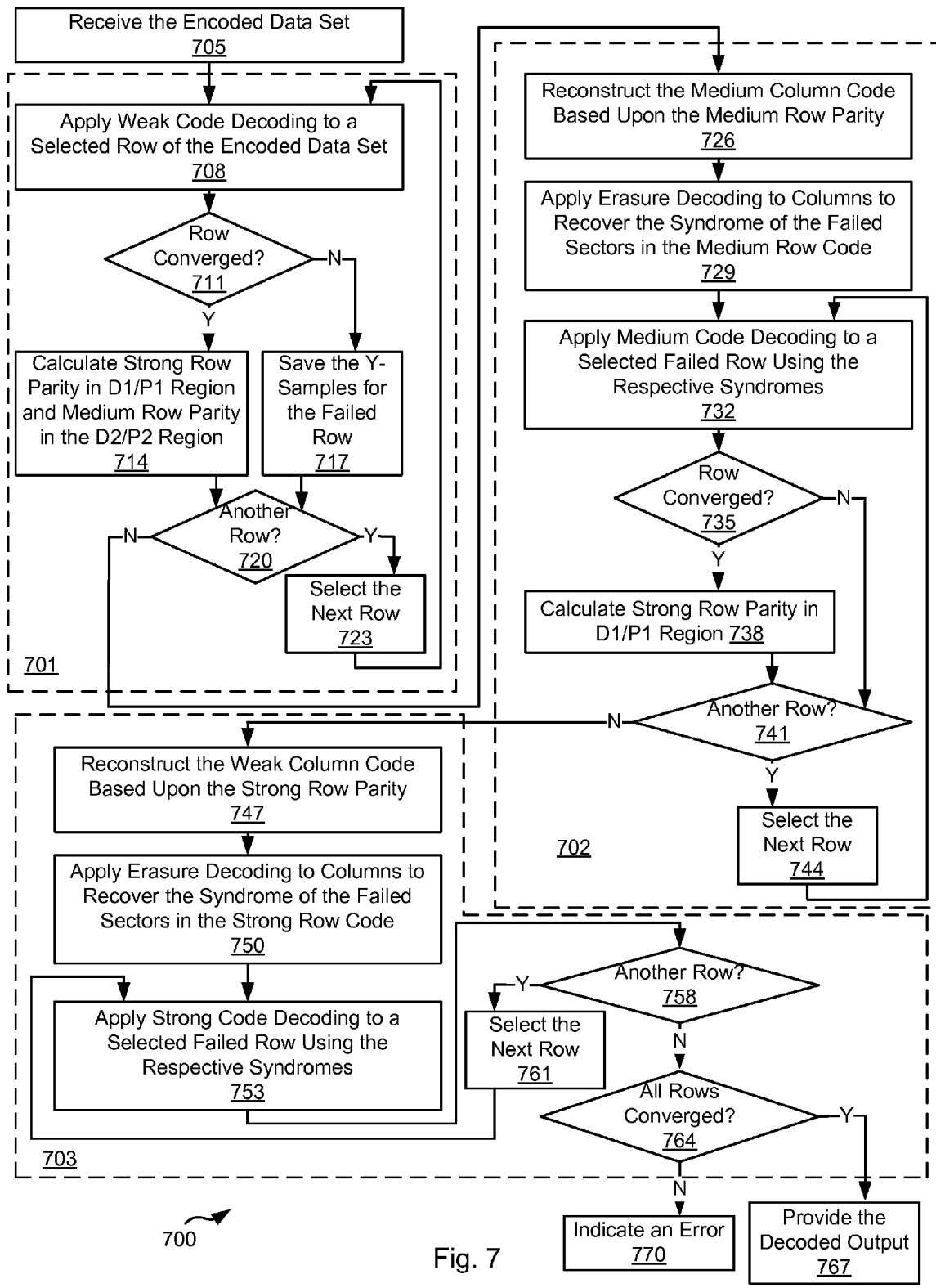
FIG. 7 is a flow diagram depicting a method for three step decoding in accordance with various embodiments of the present invention.

Turning to FIG. 7, a flow diagram 700 depicts a method for three step decoding in accordance with various embodiments of the present invention. Following flow diagram 700, an encoded data set (e.g., a data set similar to that discussed above in relation to FIGS. 4*a*-4*c*) is received (block 705). A first decoding step (block 701) is applied to the received encoded data set. The first decoding step includes applying a weak code decoding (i.e., the inverse of weak code encoding applied during the creation of decoder input by a data encoder) to the first selected row of decoder input (block 708). It is determined whether the selected row converged (i.e., the decoding of the selected row resulted in correction of all errors)(block 711). Where the selected row converged (block 711), strong row parity (i.e., parity (SP1) generated during the encoding process when strong code encoding was applied during the creation of decoder input by the data encoder) for the non-exclusive payload area including D1 (i.e., non-exclusive payload area 410) is calculated; and medium row parity (i.e., parity (MP2) generated during the encoding process when medium code encoding was applied during the creation of decoder input by the data encoder) for the non-exclusive payload area including D2 (i.e., non-exclusive payload area 420) is calculated (block 714). SP1 and MP2 are each calculated by reversing the encoding from which they originally derive. Of note, this is only done for the rows that converged as any non-converging rows are not reliable. For the rows that fail to converge, the y-samples (or other original data representing the rows) is stored for further processing (block 717). It is then determined whether there is another row in the received encoded data set that remains to be decoded using the weak code decoding (block 720). Where another row remains (block 720), the next row is selected (block 723) and the processes of blocks 708 through 720 are repeated for the next row.

Decoding result 1110 of FIG. 9*a* graphically depicts an example result after application of first decoding step (block 701). As shown, result 1110 includes a number of rows 1112*a*-1112*n* that each include an exclusive payload area 1114 corresponding to D0 of FIG. 4, non-exclusive payload area 410; non-exclusive payload area 420; and an exclusive encoding area 1119 corresponding to P3 of FIG. 4. As shown, four rows (i.e., row 1112*d*, row 1112*e*, row 1112*h* and row 1112*l*) failed to converge as indicated by the diagonal shading. All of the other rows (i.e., row 1112*a*, row 1112*b*, row 1112*c*, row 1112*f*, row 1112*g*, row 1112*i*, row 1112*j*, row 1112*k*, row 1112*m* and row 1112*n*), they all converged.

In a second decoding step (block 702), a medium column code (i.e., column code (Q2) generated during the encoding process when column encoding of non-exclusive payload area 420 is performed) is reconstructed (block 726). This reconstruction includes XORing strong data (SD2) with medium data (MD2), and XORing strong parity (SP2) with medium parity (MP2). Result 1120 of FIG. 9*b* graphically depicts an example result after application of the aforementioned reconstruction step. As shown, result 1120 still exhibits a sub-row 1122*d* (a truncated version of row 1112*d*), a sub-row 1122*e* (a truncated version of row 1112*e*), a sub-row 1122*h* (a truncated version of row 1112*h*), and a sub-row 1122*l* (a truncated version of row 1112*l*) that failed to converge. The result of XORing strong data (SD2) with medium data (MD2) is XORed with D2, and the result of XORing strong parity (SP2) with medium parity (MP2) is XORed with medium parity (P2) to yield medium column codes.

Using the calculated medium column codes, erasure decoding is applied to columns to recover the syndrome for each of the failed rows (e.g., row 1112*d*, row 1112*e*, row 1112*h*, and row 1112*l*) (block 729). These syndromes are shown in result 1123 of FIG. 9*d* where the coset leaders for the medium row code are recovered. At this juncture, the columns of non-exclusive payload region 420 is correct. Medium code decoding is then applied to each of the previously failed rows (e.g., row 1112*d*, row 1112*e*, row 1112*h* and row 1112*l*) modified to include the recovered row elements (block 732). A result 1130 of FIG. 9*e* shows an example of the medium row code decoding where only one row (i.e., a row 1132*d*) remains to converge (i.e., three of the previously failed rows are corrected). For the newly converged rows (i.e., row 1132*e*, row 1132*h* and row 1132*l*), strong row parity (SP1 and SD1) for the non-exclusive payload area 410 is calculated (block 738). A result 1140 of FIG. 9*f* provides an example of this calculation of the codeword truncated to exclude strong row parity with non-exclusive payload area 420 and an exclusive encoding area 1119. It is determined whether another failed row remains to be decoded using the medium row decoding (block 741). Where another failed row remains to be decoded (block 741), the next row is selected (block 744) and the processes of blocks 732 through 741 are repeated for the next row.

In a third decoding step (block 703), a weak column code (i.e., column code (Q1) generated during the encoding process when column encoding of non-exclusive payload area 410 is performed) is reconstructed (block 747). This reconstruction includes XORing strong data SD1 with data D1, and XORing strong parity SP1 with encoding data P1 to yield Q1. Result 1141 of FIG. 9*g* graphically depicts an example result after application of the aforementioned reconstruction step. As shown, result 1141 still exhibits a sub-row 1142*d* (a truncated version of row 1112*d*) that failed to converge. The result of XORing strong data SD1 with data D1 and XORing strong parity SP1 with encoding data P1 are weak column codes.

Using the calculated weak column codes, erasure decoding is applied to columns to recover the syndrome for each of the failed rows (e.g., row 1112*d*) (block 750). These syndromes are shown in result 1142 of FIG. 9*h* where the coset leaders for the weak row code are recovered. At this juncture, the columns of non-exclusive payload region 410 is correct. Strong code decoding is then applied to each of the previously failed rows (i.e., row 1112*d*) modified to include the recovered row elements (block 753). A result 1130 of FIG. 9*i* shows an example of the strong row code decoding where no rows remain to converge. It is determined whether another failed row remains to be decoded using the strong row decoding (block 758). Where another failed row remains to be decoded (block 758), the next row is selected (block 761) and the processes of blocks 753 through 758 are repeated for the next row. Otherwise, it is determined whether all rows converged (block 764). Where all rows converged (block 764), all of the rows re provided as a decoded output (block 767). Otherwise, an error is indicated (block 770).

Figure 8:
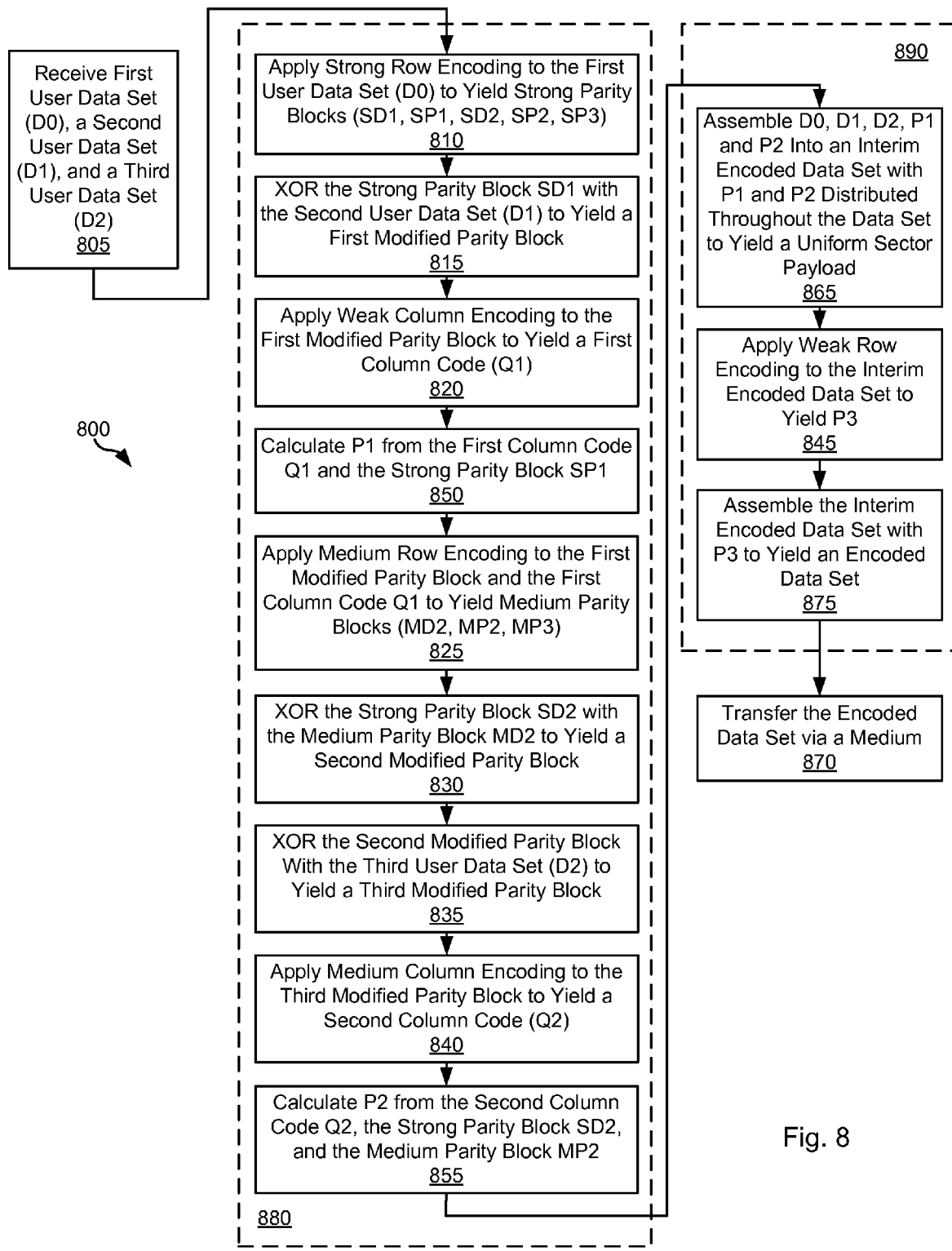
FIG. 8 is a flow diagram depicting a method for two step encoding in accordance with some embodiments of the present invention.

Turning to FIG. 8, a flow diagram 800 shows a method for two step encoding in accordance with some embodiments of the present invention. Flow diagram 800 shows a first encoding step 880 and a second encoding step 890 each outlined in dashed lines. Following flow diagram 800, a user data set is received (block 805). The user data set includes a first user data set D0, a second user data set D1 and a third user data set D2. Strong row encoding is applied to the first data set D0 to yield strong parity blocks (SD1, SP1, SD2, SP2, SP3) (block 810). For example, referring to example result 1000 of FIG. 10a, a first row of D0 is encoded to yield parity data in the first row of SD1, SD2 and SP3. As another example, a last row of D0 is encoded to yield parity data in the last row of SP1, SP2 and SP3. Again, the phrase "strong row encoding" is used in its broadest sense to mean an encoding that generates an amount of encoding data for one direction of an array of data that is greater than both "medium row encoding" and "weak row encoding". By implication, the phrase "medium row encoding" is used in its broadest sense to mean an encoding that generates an amount of encoding data for one direction of an array of data that is greater than "weak row encoding" and less than "strong row encoding"; and the phrase "weak row encoding" is used in its broadest sense to mean an encoding that generates an amount of encoding data for one direction of an array of data that is less than both "strong row encoding" and "medium row encoding".

Strong parity block SP1 is XORed with second user data set D1 to yield a first modified parity block (block 815). Weak column encoding is applied to the first modified parity block to yield a first column code (Q1) (block 820). An example result 1010 from applying the aforementioned weak column encoding (i.e., applied to the result of SD1 XOR D1 to yield Q1) is shown in FIG. 10b. Parity data P1 is then calculated from the first column code Q1 and the strong parity code SP1 by XORing SP1 and Q1 (block 850). This parity data is then stored for inclusion in the final encoded codeword.

Medium row encoding is then applied to D0 and the columns including (SD1 XOR D1) and Q1 to yield medium row encoded data MD2, MP2, MP3 (block 825). An example result 1020 from applying the aforementioned medium row encoding is shown in FIG. 10c. The strong parity block SD2 is XORed with the medium parity block MD2 and the medium parity block MP2 to yield a second modified parity block (block 830). An example result 1030 from applying the aforementioned processing is shown in FIG. 10d. The second modified parity block is then XORed with a third user data set D2 to yield a third modified parity block (block 835). Medium column encoding is applied to the third modified parity block to yield a second column code Q2 (block 840). An example result 1040 from applying the aforementioned processing is shown in FIG. 10e. Parity data P2 is then calculated from the second column code Q2, the strong parity block SD2, and the medium parity block MP2 (block 855). This parity data is then stored for inclusion in the final encoded codeword.

D0, D1, D2, P1 and P2 are assembled into an interim encoded data set with P1 and P2 distributed throughout the data set to yield a uniform sector payload (block 865). This interim encoded data set is similar to codeword 400 of FIG. 4a without the area identified as P3. P1 is distributed throughout non-exclusive payload area 410 similar to that discussed in relation to FIG. 4b, and P2 is distributed throughout non-exclusive payload area 420 similar to that discussed in relation to FIG. 4c. Weak row encoding is then applied to D0, non-exclusive payload area 410 and non-exclusive payload area 420 to yield parity data P3 (block 845). Parity data P3 is incorporated with the interim encoded data set to yield an encoded data set (block 875). Such an encoded data set is similar to that discussed above in relation to FIGS. 4a-4c. The encoded data set is then transferred via a medium (block 870).

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for out of order data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
    a data encoder circuit configured to:
        receive a user data set, wherein the user data set includes a first data portion and a second data portion;
        apply a first level encoding on a first section by section basis to the first data portion to yield a first encoding data, wherein the first encoding data includes a first encoded portion and a second encoded portion;
        apply a second level encoding on a second section by section basis to the first encoded portion to yield a first parity set;
        apply a third level encoding on the first section by section basis to a combination of at least the first data portion, the second data portion, and the first encoding data to yield a second parity set; and
        assemble at least the first data portion, the second data portion, the first parity set and the second parity set to yield an encoded data set.

2. The data processing system of claim 1, wherein the first section by section basis is orthogonal to the second section by section basis.

3. The data processing system of claim 1, wherein the first section by section basis is a row by row basis, and the second section by section basis is a column by column basis.

4. The data processing system of claim 1, wherein the first level encoding is a strong row encoding, wherein the third level encoding is a weak row by row encoding, and wherein the second level encoding is a column encoding.

5. The data processing system of claim 1, wherein the user data set further includes a third data portion, and wherein the data encoder circuit is further configurable to:
    apply a fourth level encoding on the first section by section basis to a combination of the first data portion, the second data portion, and a portion derived from the first encoded portion to yield a second encoding data, wherein the second encoding data includes a third encoded portion and a fourth encoded portion;

apply a fifth level encoding on the second section by section basis to the third encoded portion to yield a third parity set;

wherein applying the third level encoding includes applying the third level encoding on the first section by section basis to a combination of the first data portion, the second data portion, the third data portion, the first encoding data, and the second encoding data to yield the second parity set; and wherein the assembling includes assembling the first data portion, the second data portion, the third data portion, the first parity set, the second parity set and the third parity set to yield the encoded data set.

6. The data processing system of claim 5, wherein the first level encoding is a strong row encoding, wherein the third level encoding is a weak row by row encoding, wherein the fourth level encoding is a medium row encoding.

7. The data processing system of claim 6, the data processing system further comprising:
a data decoder circuit configured to:
apply a weak row decoding to the encoded data set on a row by row basis to yield at least a first decoded row and a second decoded row;
calculate strong row parity and medium row parity for each of the first decoded row and the second decoded row that failed to converge;
reconstruct a medium column code based upon the third parity set;
apply erasure decoding to columns corresponding to the third parity set to yield a first syndrome;
apply medium row decoding to each of the first decoded row and the second decoded row that failed to converge using the first syndrome to yield first second pass decode row and a second second pass decode row;
calculate strong row parity for each of the first second pass decode row and a second second pass decode row that failed to converge;
reconstruct a weak column code based upon the first parity set;
apply erasure decoding to columns corresponding to the first parity set to yield a second syndrome; and
apply strong row decoding to each of the =first second pass decode row and a second second pass decode row that failed to converge using the second syndrome to yield first third pass decode row and a second third pass decode row.

8. The data processing system of claim 1, wherein the system is implemented as an integrated circuit.

9. The data processing system of claim 1, wherein the data processing system is incorporated in a device selected from a group consisting of: a storage device, and a data transmission device.

10. The data processing system of claim 1, wherein the data processing system is incorporated in a storage device selected from a group consisting of: a hard disk drive, and a solid state drive.

11. A method for data processing, the method comprising:
receiving a user data set, wherein the user data set includes a first data portion, a second data portion, and a third data portion;
applying a first level encoding on a first section by section basis to the first data portion to yield a first encoding data, wherein the first encoding data includes a first encoded portion and a second encoded portion;
applying a second level encoding on a second section by section basis to the first encoded portion to yield a first parity set;
applying a third level encoding on the first section by section basis to a combination of the first data portion, the second data portion, and a portion derived from the first encoded portion to yield a second encoding data, wherein the second encoding data includes a third encoded portion and a fourth encoded portion;
applying a fourth level encoding on the second section by section basis to the third encoded portion to yield a third parity set;
applying a fifth level encoding on the first section by section basis to a combination of at least the first data portion, the second data portion, the third data portion, the first encoding data, and the second encoding data to yield the second parity set; and
assembling at least the first data portion, the second data portion, the third data portion; the first parity set, the second parity set, and the third parity set to yield an encoded data set.

12. The method of claim 11, wherein the first level encoding is a strong row encoding, wherein the third level encoding is a medium row encoding, wherein the fifth level encoding is a weak row encoding, wherein the second level encoding is a weak column encoding, and wherein the fourth level encoding is a strong column encoding.

13. The method of claim 12, wherein the method further comprises:
applying a weak row decoding to the encoded data set on a row by row basis to yield at least a first decoded row and a second decoded row;
calculating strong row parity and medium row parity for each of the first decoded row and the second decoded row that failed to converge;
reconstructing a medium column code based upon the third parity set;
applying erasure decoding to columns corresponding to the third parity set to yield a first syndrome;
applying medium row decoding to each of the first decoded row and the second decoded row that failed to converge using the first syndrome to yield first second pass decode row and a second second pass decode row;
calculating strong row parity for each of the first second pass decode row and a second second pass decode row that failed to converge;
reconstructing a weak column code based upon the first parity set;
applying erasure decoding to columns corresponding to the first parity set to yield a second syndrome; and
applying strong row decoding to each of the first second pass decode row and a second second pass decode row that failed to converge using the second syndrome to yield first third pass decode row and a second third pass decode row.

14. The method of claim 11, wherein the first section by section basis is orthogonal to the second section by section basis.

15. The method of claim 11, wherein the first section by section basis is a row by row basis, and the second section by section basis is a column by column basis.

16. A storage device, the storage device comprising:
an access circuit including a data encoding circuit and a data decoding circuit;
the data encoding circuit is configured to:

receive a user data set, wherein the user data set includes a first data portion, a second data portion, and a third data portion;

apply a first level encoding on a first section by section basis to the first data portion to yield a first encoding data, wherein the first encoding data includes a first encoded portion and a second encoded portion;

apply a second level encoding on a second section by section basis to the first encoded portion to yield a first parity set;

apply a third level encoding on the first section by section basis to a combination of the first data portion, the second data portion, and a portion derived from the first encoded portion to yield a second encoding data, wherein the second encoding data includes a third encoded portion and a fourth encoded portion;

apply a fourth level encoding on the second section by section basis to the third encoded portion to yield a third parity set;

apply a fifth level encoding on the first section by section basis to a combination of at least the first data portion, the second data portion, the third data portion, the first encoding data, and the second encoding data to yield the second parity set; and assemble at least the first data portion, the second data portion, the third data portion; the first parity set, the second parity set, and the third parity set to yield an encoded data set.

17. The storage device of claim 16, wherein the first level encoding is a strong row encoding, wherein the fifth level encoding is a weak row by row encoding, and wherein the third level encoding is a medium row encoding.

18. The storage device of claim 17, wherein the data decoding circuit is configured to:

apply a weak row decoding to the encoded data set on a row by row basis to yield at least a first decoded row and a second decoded row;

calculate strong row parity and medium row parity for each of the first decoded row and the second decoded row that failed to converge;

reconstruct a medium column code based upon the third parity set;

apply erasure decoding to columns corresponding to the third parity set to yield a first syndrome;

apply medium row decoding to each of the first decoded row and the second decoded row that failed to converge using the first syndrome to yield first second pass decode row and a second second pass decode row;

calculate strong row parity for each of the first second pass decode row and a second second pass decode row that failed to converge;

reconstruct a weak column code based upon the first parity set;

apply erasure decoding to columns corresponding to the first parity set to yield a second syndrome; and apply strong row decoding to each of the first second pass decode row and a second second pass decode row that failed to converge using the second syndrome to yield first third pass decode row and a second third pass decode row.

19. The storage device of claim 16, wherein the access circuit is implemented as an integrated circuit.

20. The storage device of claim 16, wherein the storage device selected from a group consisting of: a hard disk drive, and a solid state drive.

* * * * *